(12) United States Patent
Nishimura

(10) Patent No.: US 10,483,082 B2
(45) Date of Patent: Nov. 19, 2019

(54) EVALUATION METHOD, CORRECTION METHOD, RECORDING MEDIUM AND ELECTRON BEAM LITHOGRAPHY SYSTEM

(71) Applicant: NuFlare Technology, Inc., Yokohama-shi (JP)

(72) Inventor: Rieko Nishimura, Kanagawa-ken (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/978,747

(22) Filed: May 14, 2018

(65) Prior Publication Data

US 2018/0269028 A1    Sep. 20, 2018

Related U.S. Application Data

(62) Division of application No. 15/361,276, filed on Nov. 25, 2016, now Pat. No. 9,997,329.

(30) Foreign Application Priority Data

Nov. 26, 2015  (JP) .................................. 2015-230771
Sep. 5, 2016   (JP) .................................. 2016-172750

(51) Int. Cl.
*H01J 37/22* (2006.01)
*H01J 37/09* (2006.01)
(Continued)

(52) U.S. Cl.
CPC ............ *H01J 37/222* (2013.01); *H01J 37/09* (2013.01); *H01J 37/3177* (2013.01); *H01J 2237/0453* (2013.01); *H01J 2237/30455* (2013.01)

(58) Field of Classification Search
CPC ........ H01J 37/222; H01J 37/244; H01J 37/09; H01J 37/3177; H01J 37/304;
(Continued)

(56) References Cited

U.S. PATENT DOCUMENTS 5,283,440 A    2/1994  Sohda
5,751,004 A    5/1998  Robinson
(Continued)

FOREIGN PATENT DOCUMENTS

JP    H07-142352 A    6/1995
JP    2013-197468 A   9/2013
(Continued)

OTHER PUBLICATIONS

Office Action dated Nov. 28, 2017 in Korean Patent Application No. 10-2016-0156471 with English translation, 13 pages.
(Continued)

*Primary Examiner* — Nicole M Ippolito
*Assistant Examiner* — Sean M Luck
(74) *Attorney, Agent, or Firm* — Oblon, McClelland, Maier & Neustadt, L.L.P.

(57) ABSTRACT

An evaluation method according to an embodiment is to evaluate a precision of an aperture formed with multiple openings, and includes steps of forming a first evaluation pattern based on evaluation data using multiple electron beams generated by electron beam that has passed through the aperture, dividing the aperture into multiple regions, each of the regions including the multiple openings and defining the multiple divided regions, forming a second evaluation pattern based on evaluation data using the electron beam that has passed through a first divided region among the multiple divided regions, comparing the first evaluation pattern with the second evaluation pattern, and evaluating the precision of the aperture based on the comparison result between the first evaluation pattern and the second evaluation pattern.

9 Claims, 34 Drawing Sheets

(51) Int. Cl.
 *H01J 37/317* (2006.01)
 *H01J 37/304* (2006.01)
(58) Field of Classification Search
 CPC ..... H01J 2237/30455; H01J 2237/0453; H01J 2237/0435; H01J 2237/30433
 See application file for complete search history.

(56) References Cited

U.S. PATENT DOCUMENTS

| | | | |
|---|---|---|---|
| 8,080,809 | B2 | 12/2011 | Abe |
| 8,552,405 | B2 | 10/2013 | Kato |
| 8,779,379 | B2 | 7/2014 | Nishimura |
| 9,147,552 | B2 | 9/2015 | Motosugi |
| 9,837,247 | B2 | 12/2017 | Kato et al. |
| 2002/0142496 | A1 | 10/2002 | Nakasuji |
| 2009/0008568 | A1 | 1/2009 | Abe |
| 2009/0153749 | A1 | 6/2009 | Mixon |
| 2012/0305763 | A1 | 12/2012 | Chirko |
| 2013/0252145 | A1 | 9/2013 | Matsumoto |
| 2014/0284500 | A1* | 9/2014 | Nishimura .......... H01J 37/3174 250/492.2 |
| 2014/0348414 | A1 | 11/2014 | Hashimoto |
| 2015/0041684 | A1 | 2/2015 | Kato et al. |

FOREIGN PATENT DOCUMENTS

| | | |
|---|---|---|
| KR | 10-2009-0004730 A | 1/2009 |
| KR | 10-2015-0018401 A | 2/2015 |
| KR | 10-2015-0110296 A | 10/2015 |

OTHER PUBLICATIONS

Office Action dated Sep. 10, 2019, in Japanese Patent Application No. 2016-172750, filed Sep. 5, 2016, w/English-language Translation.

* cited by examiner

EVALUATION METHOD, CORRECTION METHOD, RECORDING MEDIUM AND ELECTRON BEAM LITHOGRAPHY SYSTEM

CROSS REFERENCE TO RELATED APPLICATIONS

This application is a Divisional of U.S. application Ser. No. 15/361,276 filed Nov. 25, 2016, and is based upon and claims the benefit of priority from the prior Japanese Patent Applications No. 2015-230771 filed in Japan on Nov. 26, 2015, and No. 2016-172750 filed in Japan on Sep. 5, 2016, the entire contents of all of which are incorporated herein by reference.

FIELD

The present disclosure relates to an evaluation method, a correction method, a recording medium, and an electron beam lithography system.

BACKGROUND

In lithography processes for recording media like flash memories, and semiconductor elements that form a Central Processing Unit (CPU), an original pattern formed in a mask is transferred to a wafer that will be the substrate of a semiconductor element. The original pattern is formed in the mask by, for example, an electron beam lithography system.

In recent years, in view of the accomplishment of an improved throughput, multi-beam type electron beam lithography systems capable of forming a pattern using multiple electron beams are introduced in industries. Such electron beam lithography systems cause electron beam emitted from a single electron source to pass through an aperture formed with multiple openings, and thus the electron beam is split to multiple beams. Hence, each electron beam has variabilities in the spot shape and the dose amount in accordance with the process precision of the aperture.

The dose amount of electron beam is controllable to some level by, for example, adjusting the exposure time. When, however, in view of the increase in number of electron beams applied for lithography in future, it is expected that a precise pattern formation becomes difficult by simply controlling the dose amount of electron beam. Hence, in order to form a precise pattern, it is necessary to selectively utilize an aperture that has little variability in opening shape, and to precisely split electron beam at first.

DETAILED DESCRIPTION

Figure 1:
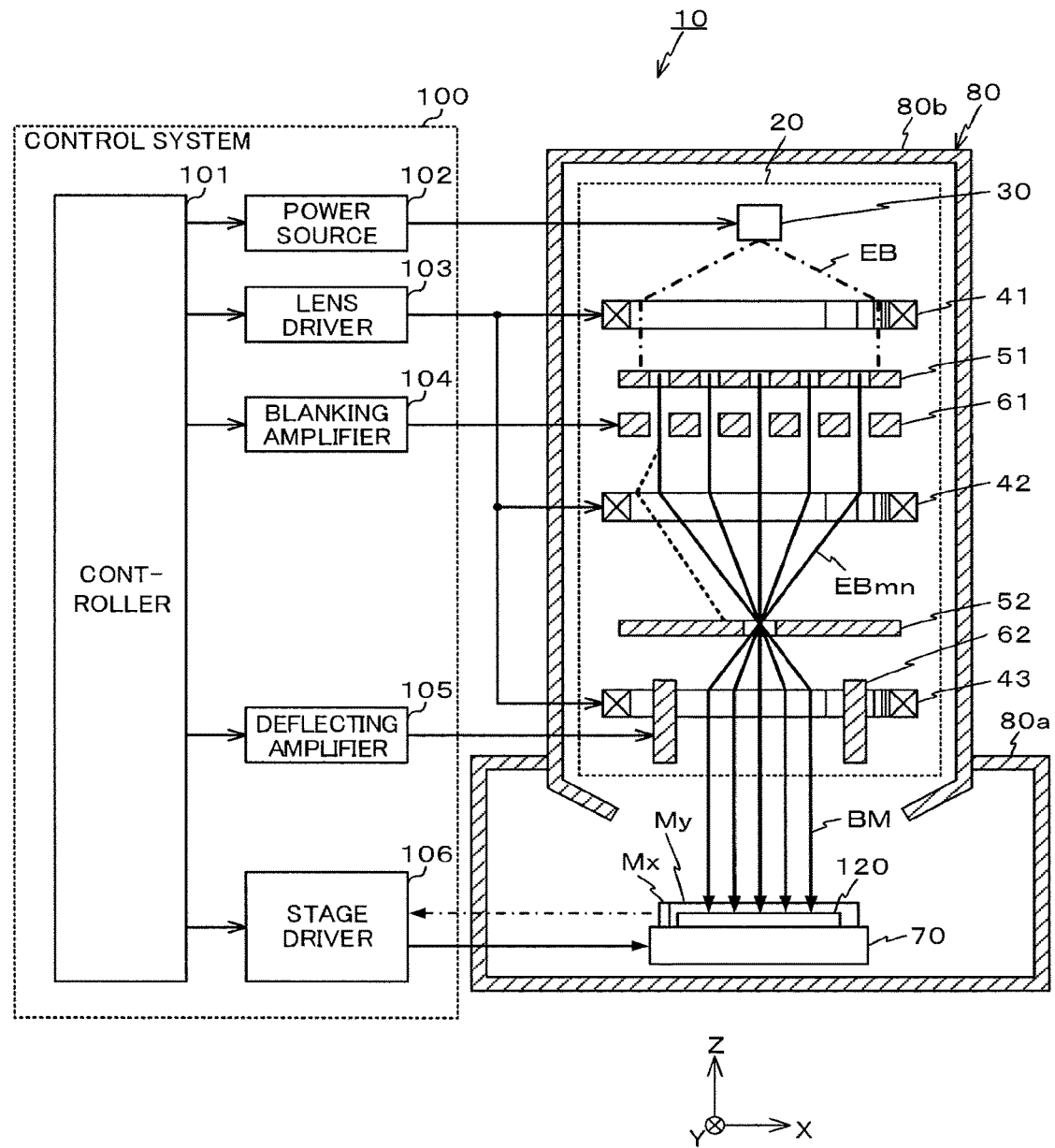
FIG. 1 is a diagram illustrating a schematic structure of an electron beam lithography system according to an embodiment.

An evaluation method according to an embodiment of the present disclosure is to evaluate the precision of an aperture formed with multiple openings, and includes a step of forming a first evaluation pattern based on evaluation data using multiple electron beams generated by electron beam that has passed through the aperture, a step of dividing the aperture into multiple regions, each of the regions including the multiple openings, and defining the multiple divided regions, a step of forming a second evaluation pattern based on evaluation data using the electron beam that has passed through a first divided region among the multiple divided regions, a step of comparing the first evaluation pattern with the second evaluation pattern, and a step of evaluating the precision of the aperture based on the comparison result between the first evaluation pattern and the second evaluation pattern.

A first correction method according to an embodiment of the present disclosure is to correct the dose amount of each of multiple electron beams that pass through the aperture formed with the multiple openings, and includes a step of dividing the aperture into the multiple regions, each of the regions including the multiple openings, and defining the multiple divided regions, a step of forming the first evaluation pattern including a marking corresponding to each of the multiple electron beams using the multiple electron beams generated by electron beam that has passed through the first divided region based on the evaluation data, a step of obtaining a first correction value based on the difference in size of respective markings in the first evaluation pattern relative to a preset reference pattern, a step of forming the second evaluation pattern including a marking corresponding to each of the multiple electron beams using the multiple electron beams generated by electron beam that has passed through the second divided region, a step of obtaining a second correction value based on a difference in size of the respective markings in the second evaluation pattern corresponding to the markings in the first evaluation pattern by comparing the first evaluation pattern with the second evaluation pattern, and a step of correcting the dose amount of the electron beam that has passed through the first divided region based on the first correction value, and correcting the dose amount of the electron beam that has passed through the second divided region based on the sum of the first correction value and the second correction value.

Still further, a second correction method according to an embodiment of the present disclosure is to correct the dose amount of each of multiple electron beams that pass through the aperture formed with the multiple openings, and includes a step of executing the evaluation method according to the present disclosure, a step of obtaining a first correction value based on the difference in size of respective markings in the second evaluation pattern relative to the marking in the preset reference pattern, a step of obtaining a second correction value based on the difference in size between the marking in the second evaluation pattern and the marking in the first evaluation pattern using the evaluation result through the evaluation method, and a step of correcting the dose amount of the electron beam that has passed through the first divided region based on the first correction value, and correcting the dose amount of the electron beam that has passed through the divided region other than the first divided region based on the sum of the first correction value and the second correction value.

A third correction method according to an embodiment of the present disclosure includes a comparison step of comparing a first pattern formed by electron beam shot by a first number of times based on the evaluation data with a second pattern formed by the electron beam shot by a second number of times based on the evaluation data, and a correction step of correcting the dose amount of the electron beam based on the comparison result between the first pattern and the second pattern.

A program according to an embodiment of the present disclosure causes a controller for an electron beam lithography system including the aperture formed with the multiple openings to execute a procedure of forming the first evaluation pattern based on the evaluation data using multiple electron beams generated by electron beam that has passed through the aperture, a procedure of dividing the aperture into the multiple regions, each of the regions including the multiple openings, and defining the multiple divided regions, a procedure of forming the second evaluation pattern based on the evaluation data and using electron beam that has passed through the first divided region among the multiple divided regions, a procedure of comparing the first evaluation pattern with the second evaluation pattern, and a procedure of evaluating the precision of the aperture based on the comparison result between the first evaluation pattern and the second evaluation pattern.

An electron beam lithography system according to an embodiment of the present disclosure forms a pattern on a sample, and includes a memory that stores the program according to the present disclosure, and a controller that executes the stored program in the memory.

<<First Embodiment>>

An explanation will be given of an embodiment with reference to the accompanying drawings. As for the explanation for the embodiment, a Cartesian coordinate system including orthogonal X-axis, Y-axis, and Z-axis to each other will be applied as appropriate.

FIG. 1 is a diagram illustrating a schematic structure of an electron beam lithography system 10 according to an embodiment. The electron beam lithography system 10 forms a pattern on a sample 120, such as a mask or a reticle on which a resist material is applied under a vacuum condition.

As illustrated in FIG. 1, the electron beam lithography system 10 includes an emitting unit 20 that emits electron beam EB to the sample 120, a stage 70 on which the sample 120 is placed, a vacuum chamber 80 that houses therein the emitting unit 20 and the stage 70, and a control system 100 that controls the emitting unit 20 and the stage 70.

The vacuum chamber 80 includes a writing chamber 80$a$ that houses therein the stage 70, and a mirror barrel 80$b$ that houses therein the emitting unit 20.

The writing chamber 80$a$ is a hollow member in a cuboid shape, and a circular opening is formed in the upper surface. The mirror barrel 80$b$ is a cylindrical casing that has the lengthwise direction in the Z-axis direction. The mirror barrel 80$b$ is formed of, for example, stainless steel, and is electrically grounded. The mirror barrel 80$b$ is drawn in the writing chamber 80$a$ via the opening formed in the upper surface of the writing chamber 80$a$. The interior of the writing chamber 80$a$ and that of the mirror barrel 80$b$ are maintained to the vacuum level of, for example, $10^{-7}$ Pa.

The emitting unit 20 includes an electron gun 30, three lenses 41, 42, 43, two apertures 51, 52, a blanking unit 61, and a deflector 62 all placed in the mirror barrel 80$b$.

The electron gun 30 is disposed in the mirror barrel 80$b$ at the upper location. The electron gun 30 is, for example, a hot-cathode electron gun. The electron gun 30 includes, for example, a cathode, a Wehnelt electrode provided so as to surround the cathode, and an anode disposed below the cathode. The electron gun 30 emits the electron beam EB downwardly when a high voltage is applied.

The lens 41 is an annular electromagnetic lens, and is disposed below the electron gun 30. The lens 41 shapes the electron beam EB that travels so as to spread downwardly to be in parallel with the vertical direction.

Figure 2:
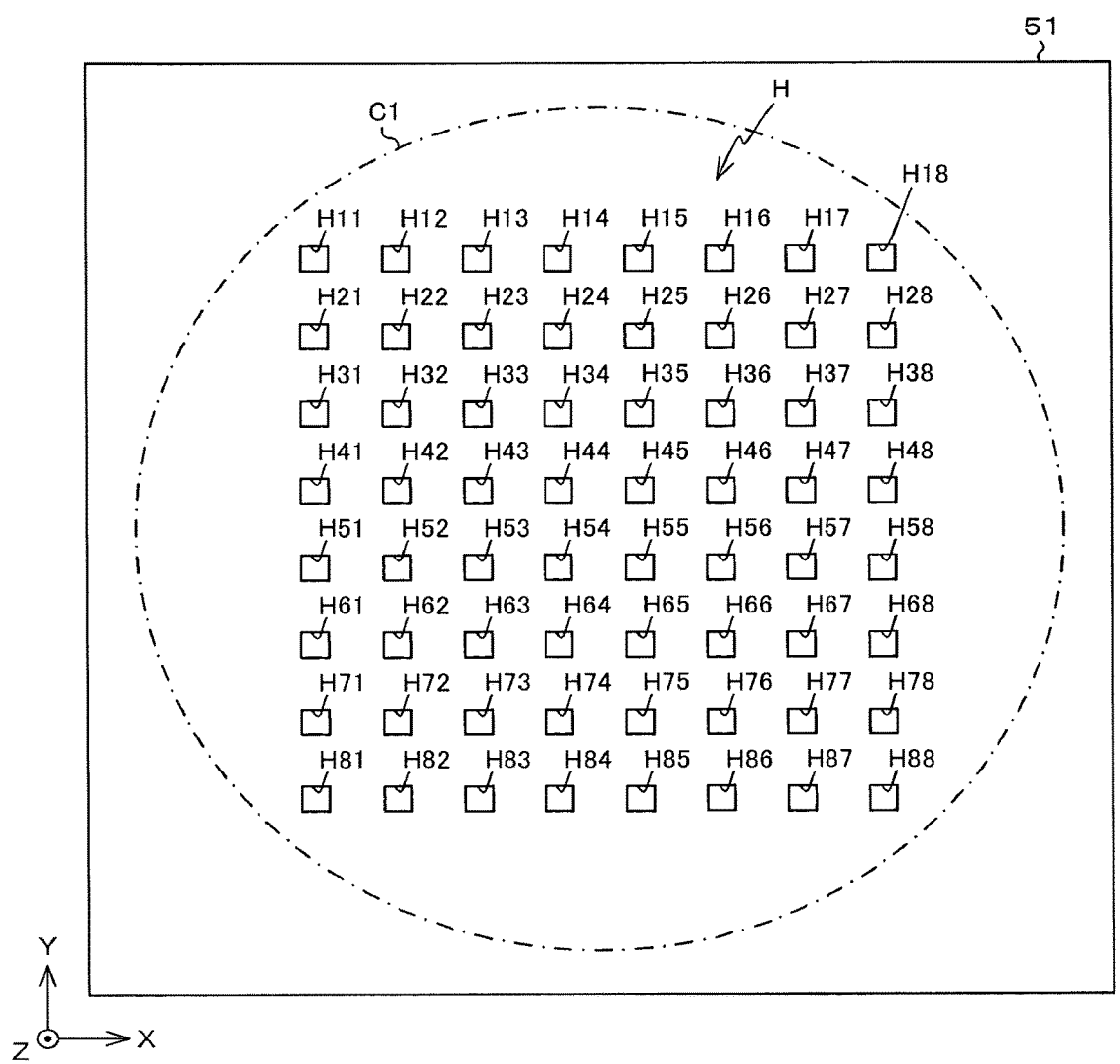
FIG. 2 is a plan view for an aperture.

The aperture 51 is a member to split the incident electron beam EB into multiple electron beams EBmn. FIG. 2 is a plan view of the aperture 51. As illustrated in FIG. 2, the aperture 51 is a square tabular member. The aperture 51 is formed of a base material like silicon, and has a plating layer like chrome or a sputtering layer formed on the surface. The aperture 51 is formed with 64 openings H in an eight-by-eight matrix arrangement that has the row and the column in the X-axis direction and the Y-axis direction, respectively. The opening H is in a square shape that has each side in parallel with the Y-axis or X-axis direction, and the dimension in the Y-axis direction and the dimension in the X-axis direction are substantially uniform among the multiple openings H.

In this embodiment, by applying integers m, n between 1 and 8, the 64 openings H are indicated as Hmn. The first opening in the first row at the most +Y side is indicated as H1n. In addition, the openings in the second to eighth rows are indicated as H2n to H8n, respectively. Still further, the first opening in the first column at the most −X side is indicated as Hm1. The openings in the second to eighth columns are indicated as Hm2 to Hm8, respectively.

Figure 3:
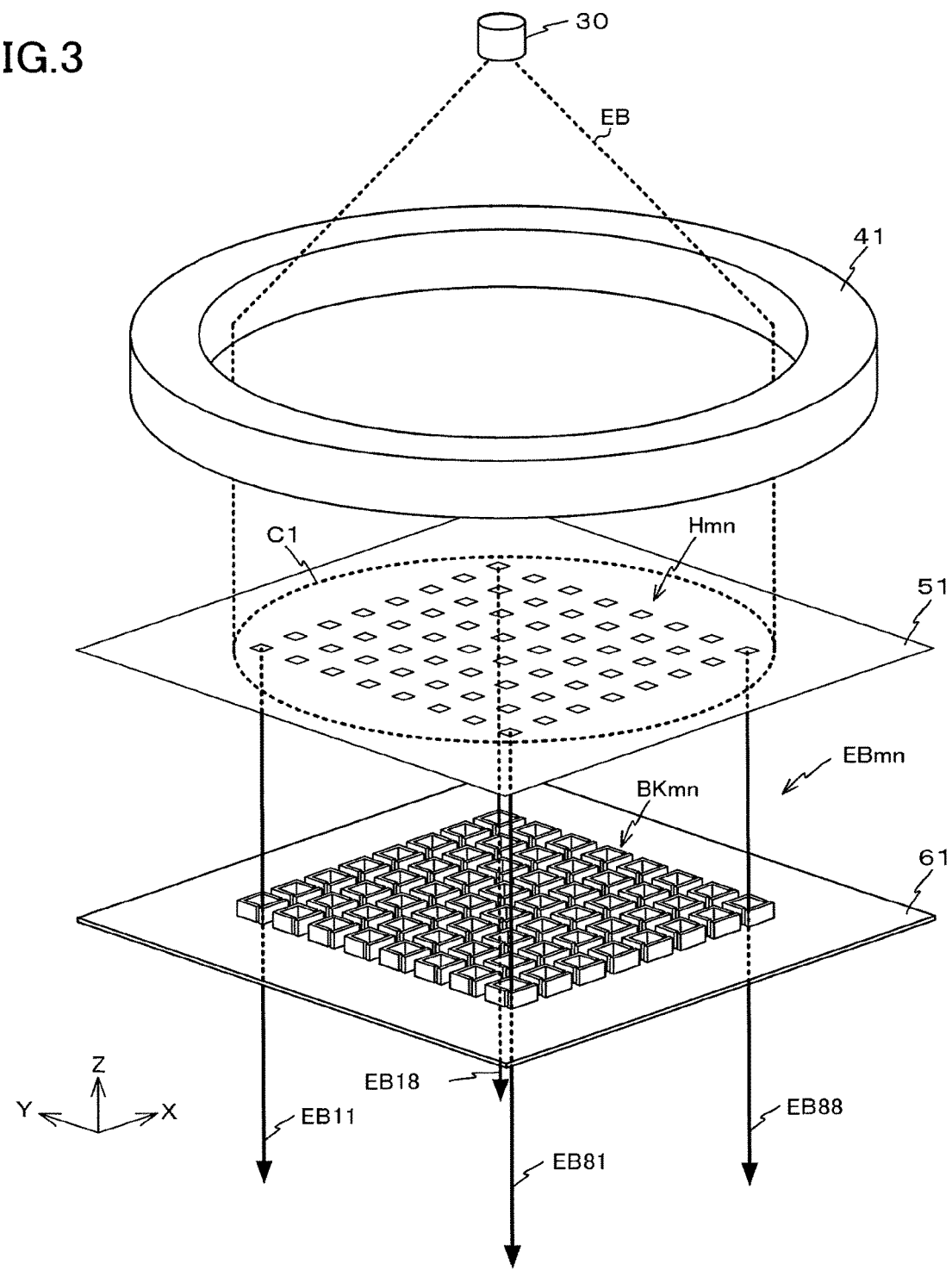
FIG. 3 is a perspective view for an electron gun, a lens, an aperture, and a blanking unit.

FIG. 3 is a perspective view of the electron gun 30, the lens 41, the aperture 51, and the blanking unit 61. As illustrated in FIG. 3, the emitted electron beam EB by the electron gun 30 is shaped so as to be in parallel with the vertical direction by the lens 41. The electron beam EB shaped in parallel with the vertical direction enters a circular region C1 indicated by a virtual line. The electron beam EB entering the region C1 is partially blocked by the aperture 51, and the remaining passes through the openings Hmn of the aperture 51. Hence, the electron beam EB is divided (split to multiple beams) into 64 electron beams travelling downwardly in the vertical direction.

In this embodiment, the electron beam that has passed through the opening Hmn of the aperture 51 is indicated as electron beam EBmn. FIG. 3 representatively illustrates only electron beams EB11, EB18, EB81, and EB88 that have passed through the openings H11, H18, H81, and H88, respectively.

Figure 4:
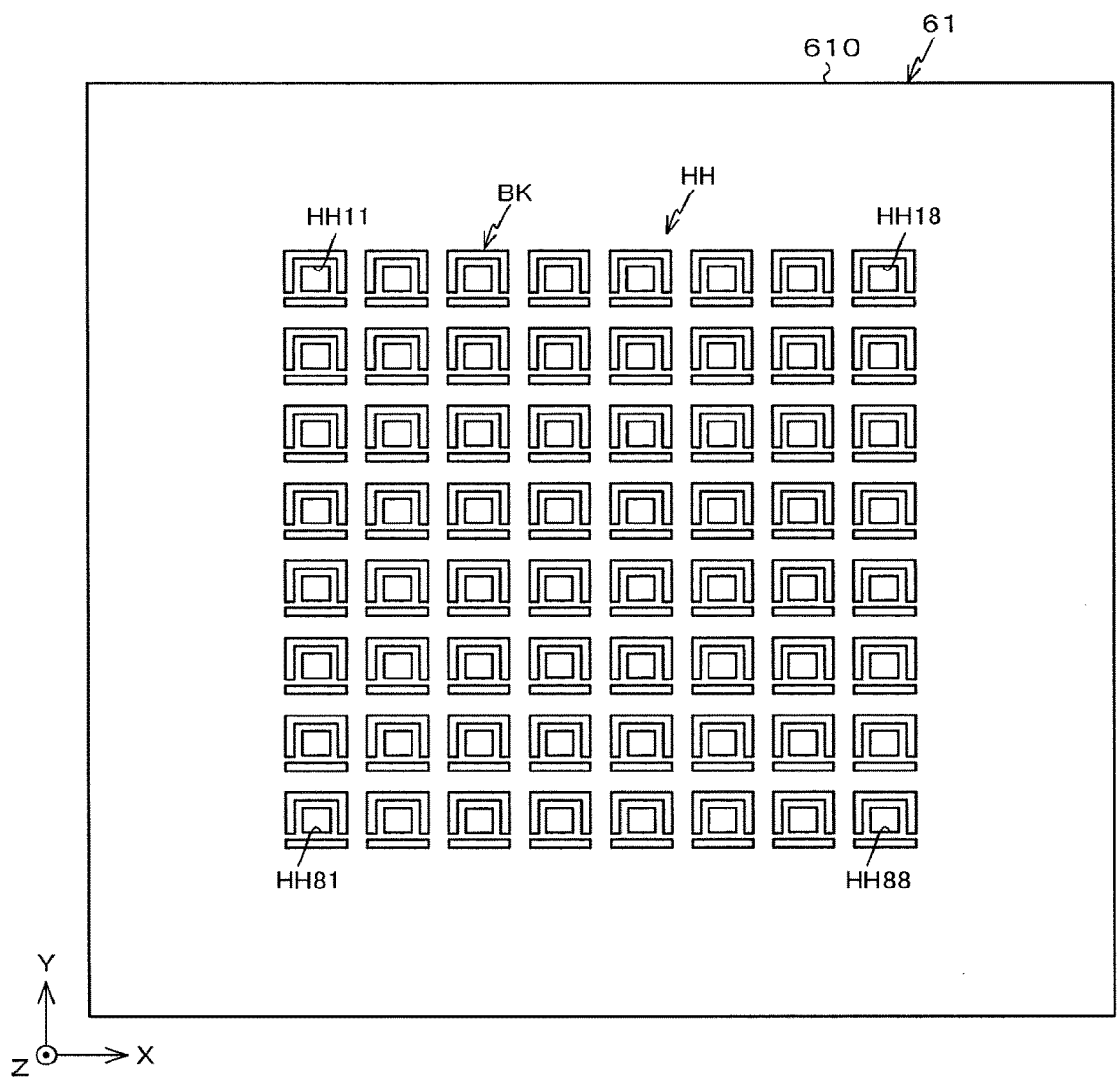
FIG. 4 is a plan view for the blanking unit.

The blanking unit 61 performs blanking on the individual electron beam EBmn. FIG. 4 is a plan view of the blanking unit 61. As illustrated in FIG. 4, the blanking unit 61 includes a substrate 610, and 64 blankers BK provided on the upper surface (the surface at the +Z side) of the substrate 610.

The substrate 610 is a square substrate formed of, for example, silicon. 64 openings HH are formed in the substrate 610 in an eight-by-eight matrix arrangement. Each of the 64 openings HH is positioned so as to be located below each opening H of the aperture 51. In this embodiment, the opening HH located right below the opening Hmn is indicated as the opening HHmn.

The opening HHmn is slightly larger than the opening Hmn, enabling the electron beam EBmn having passed through the opening Hmn to pass through the opening HHmn without an interference with the substrate 610.

Figure 5:
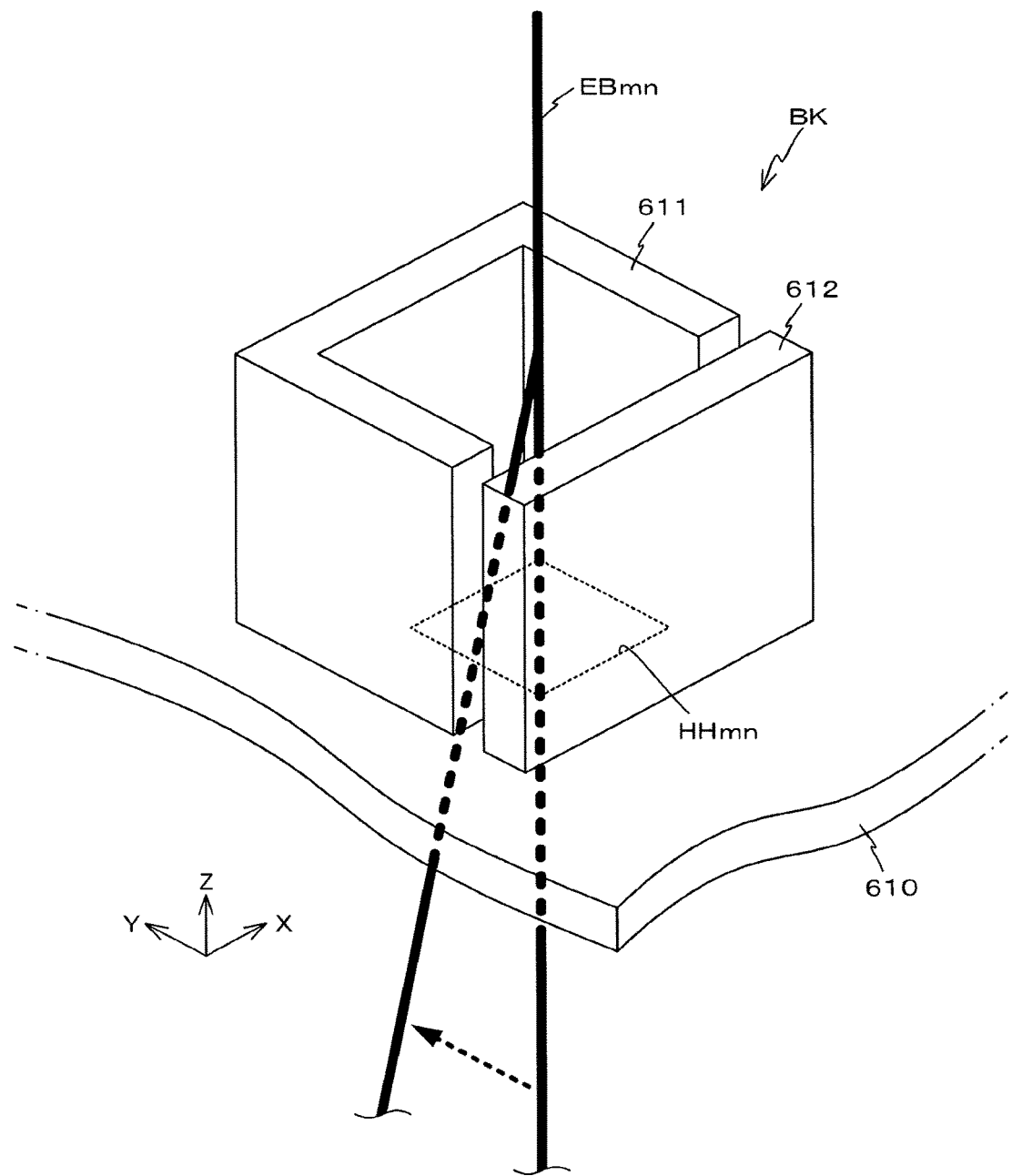
FIG. 5 is a perspective view illustrating a blanker in an enlarged manner.

FIG. 5 is a perspective view illustrating the blanker BK in an enlarged manner. The blanker BK includes a pair of electrodes 611, 612 formed of a metal like copper. The electrode 611 is, for example, in a U-shape as viewed from the XY cross-section. The electrode 611 is disposed along the outer edges of the opening HHmn provided in the substrate 610 at the +X side and −X side, and the outer edge at the +Y side. In addition, the electrode 612 is a tabular electrode, and is disposed along the outer edge of the opening HHmn at the −Y side. Hence, as is clear from FIG. 5, the electron beam EB that has passed through the aperture 51 passes through the gap between the electrodes 611, 612 that form the blanker BK, and enters the opening HHmn of the substrate 610.

As illustrated in FIGS. 3, 4, the blanker BK is provided for each opening HHmn. In this embodiment, the blanker BK provided for the opening HHmn is indicated as the blanker BKmn.

The electrode 611 is grounded via an unillustrated circuit provided on the substrate 610. In addition, the electrode 612 is connected to a blanking amplifier 104 that forms the control system 100 via an unillustrated circuit provided on the substrate 610. When the voltage is applied to the electrode 612 by the blanking amplifier 104, the electron beam EBmn entering the opening HHmn of the substrate 610 is deflected in the direction indicated by an arrow in FIG. 5. Hence, as illustrated in FIG. 1, the electron beam EBmn is blocked by an aperture 52, and thus blanking is performed on the electron beam EBmn.

The lens 42 is an annular electromagnetic lens, and is disposed below the blanking unit 61. The lens 42 converges the electron beams EBmn which have passed through the blanking unit 61 and which travel downwardly in parallel with each other toward the adjacent location to the aperture 52.

The aperture 52 is a tabular member provided with an opening at the center through which the electron beam EB passes. The aperture 52 is disposed adjacent to the convergence point (cross-over point) of the electron beam EB that has passed through the lens 42. Each electron beam EBmn passes through the opening of the aperture 52, and thus each electron beam EBmn has the adjusted shot shape. In addition, when the electron beam EBmn is deflected by the blanker BK of the blanking unit 61, the aperture 51 performs blanking on the electron beam EBmn.

The deflector 62 is disposed below the aperture 52. The deflector 62 includes multiple pairs of electrodes disposed so as to face with each other. The deflector 62 deflects the electron beam EBmn that has passed through the aperture 52 in accordance with the applied voltage to the electrode. In this embodiment, for the purpose of simplification of explanation, only a single pair of electrodes disposed so as to be apart from each other in the X-axis direction by a predetermined distance is illustrated in the figure. The deflector 62 is capable of deflecting the electron beam EBmn in the X-axis direction and in the Y-axis direction.

The lens 43 is an annular electromagnetic lens disposed so as to surround the deflector 62. The lens 43 works together with the deflector 62, thereby focusing the electron beam EBmn to the desired position on the sample 120 placed on the stage 70.

The stage 70 is disposed inside the writing chamber 80a. The stage 70 is capable of moving within at least the horizontal planar direction with the sample 120 on which the pattern is to be formed being held substantially horizontally. Provided on the upper surface of the stage 70 are a mirror Mx that has the lengthwise direction which is the Y-axis direction, and a mirror My that has the lengthwise direction which is the X-axis direction. The position of the stage 70 within the horizontal planar direction is detected with reference to the mirrors Mx, My.

The control system 100 controls the emitting unit 20 and the stage 70. The control system 100 includes a controller 101, a power source 102, a lens driver 103, the blanking amplifier 104, a deflecting amplifier 105, and a stage driver 106.

Figure 6:
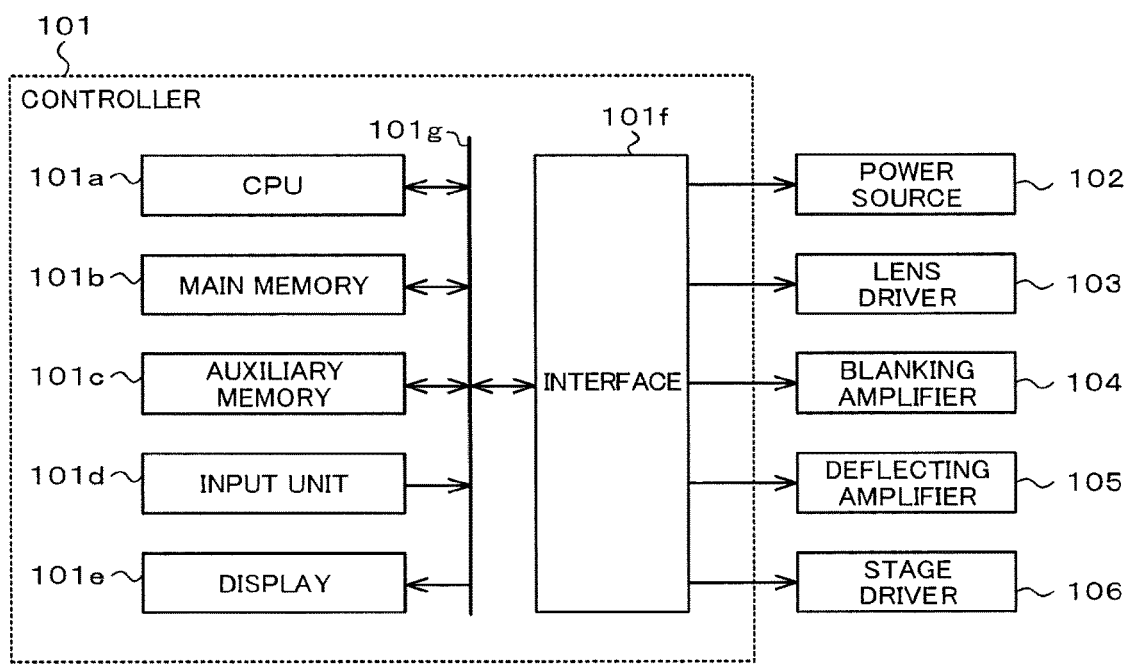
FIG. 6 is a block diagram of a controller.

FIG. 6 is a block diagram of the controller 101. As illustrated in FIG. 6, the controller 101 is a computer that includes a Central Processing Unit (CPU) 101a, a main memory 101b, an auxiliary memory 101c, an input unit 101d, a display 101e, an interface 101f, and a system bus 101g connecting those components together.

The CPU 101a reads and executes a program stored in the auxiliary memory 101c. The CPU 101a comprehensively controls the devices forming the control system 100 in accordance with the program.

The main memory 101b includes a volatile memory like a Random-Access Memory (RAM). The main memory 101b is utilized as a work area for the CPU 101a.

The auxiliary memory 101c includes a non-volatile memory, such as a Read-Only Memory (ROM), a magnetic disk, or a semiconductor memory. The auxiliary memory 101c stores the program to be executed by the CPU 101a, and various parameters. In addition, the auxiliary memory 101c stores evaluation data to determine the process precision of the aperture 51. This evaluation data defines the evaluation pattern to be formed on the sample 120. The details of the evaluation pattern will be explained later.

The input unit 101d includes a keyboard, and a pointing device like a mouse. The user instruction is input via the input unit 101d, and is transmitted to the CPU 101a via the system bus 101g.

The display 101e includes a display device like a Liquid Crystal Display (LCD). The display 101e displays, for example, the status of the electron beam lithography system 10, and information on a lithography pattern.

The interface 101f includes a LAN interface, a serial interface, a parallel interface, an analog interface, etc. The power source 102, the lens driver 103, the blanking amplifier 104, the deflecting amplifier 105, and the stage driver 106 are connected to the controller 101 via the interface 101f.

The controller 101 employing the above structure comprehensively controls the power source 102, the lens driver 103, the blanking amplifier 104, the deflecting amplifier 105, and the stage driver 106.

Returning to FIG. 1, the power source 102 applies the voltage to the electron gun 30 based on the instruction from the controller 101. This causes the electron gun 30 to emit the electron beam EB downwardly.

The lens driver 103 controls the power of the lens 41 (refractive power thereof) relative to the electron beam EB based on the instruction from the controller 101, and shapes the electron beam EB traveling so as to spread downwardly to electron beam that travels in parallel with the vertical axis. In addition, the lens driver 103 controls the power of the lens 42, converges the electron beams EBmn toward the center of the aperture 52, and controls the power of the lens 43, thereby focusing the electron beams EBmn to the upper surface of the sample 120.

The blanking amplifier 104 generates, for each blanker BK forming the blanking unit 61, a blanking signal based on the instruction from the controller 101. Next, the blanking amplifier 104 outputs the generated blanking signal to the electrode 612 of each blanker BK. For example, the blanking signal takes two values that are a high level and a low level. When the blanking signal output to the electrode 612 of the blanker BK is a high level, the blanking is performed on the electron beam EBmn. Hence, by outputting the modulated blanking signal in accordance with the lithography pattern to each blanker BK, a desired pattern can be formed on the sample 120. In addition, by outputting a voltage signal maintained to the high level to the desired blanker BK, the desired electron beam EBmn can be in a state having undergone blanking.

The deflecting amplifier 105 generates the voltage signal based on the instruction from the control signal 101, and outputs the voltage signal to the electrode forming the deflector 62. Hence, a potential difference is produced between the electrodes of the deflector 62. The electron beam EBmn passing through the deflector 62 is deflected by what corresponds to the potential difference.

The stage driver 106 measures the position of the mirror mx and that of the mirror My of the stage 70 using an unillustrated laser sensor, and detects the position of the stage 70 based on the measurement result. Next, the stage driver 106 drives the stage 70 based on the instruction from the controller 101, thereby moving and positioning the sample 120.

According to the above electron beam lithography system 10, the controller 101 comprehensively controls the power source 102, the lens driver 103, the blanking amplifier 104, the deflecting amplifier 105, and the stage driver 106. When, for example, the pattern is formed on the sample 120 using the electron beam lithography system 10, the CPU 101a of the controller 101 drives the stage 70 on which the sample 120 is mounted, thereby positioning the sample 120 below the emitting unit 20.

Next, the CPU 101a drives the power source 102 to apply the voltage to the electron gun 30. This causes the electron gun 30 to emit the electron beam EB.

When the electron gun 30 starts emitting the electron beam EB, the CPU 101a controls the lens 41 via the lens driver 103 so as to shape the electron beam EB spreading downwardly to be in parallel with the vertical axis.

The electron beam EB shaped by the lens 41 travels downwardly, and passes through the aperture 51. Hence, the electron beam EB is split, and the multiple (64) electron beams EBmn are generated. Those electron beams EBmn pass through the openings HHmn of the substrate 610 forming the blanking unit 61 via the respective blankers BKmn of the blanking unit 61.

The CPU 101a controls the lens 42 via the lens driver 103 to converge the electron beams EBmn having passed through the blanking unit 61 to the adjacent location to the opening of the aperture 52.

Each electron beam EBmn has the shot outer diameter and shape adjusted by the electron beam having passed through the opening of the aperture 52. The electron beam EBmn that has passed through the aperture 52 enters the lens 43.

The CPU 101a controls the lens 43 via the lens driver 103 to focus the entering electron beams EBmn in the lens 43 to the surface of the sample 120 held on the stage 70. In addition, the CPU 101a deflects the electron beam EBmn in the X-axis direction or in Y-axis direction via the deflecting amplifier 105, thereby controlling the entering position of the electron beam EBmn relative to the sample 120.

Simultaneously with the above action, the CPU 101a inputs the modulated blanking signal based on the pattern to be formed in each blanker BKmn via the blanking amplifier 104. Hence, the electron beam EBmn is deflected at a predetermined timing, and thus blanking is intermittently performed on the electron beam EBmn.

According to the electron beam lithography system 10, as explained above, the blanking amplifier 104 and the deflecting amplifier 105 work together, thereby exposing the sample 120 against the modulated electron beam EBmn based on the lithography pattern, and forming the pattern on the sample 120.

<<Evaluation Pattern Formation Process>>

Next, an explanation will be given of an evaluation pattern formation process to evaluate the precision of the aperture 51 applied for the electron beam lithography system 10. This evaluation pattern is to evaluate the process precision of the aperture.

Figure 7:
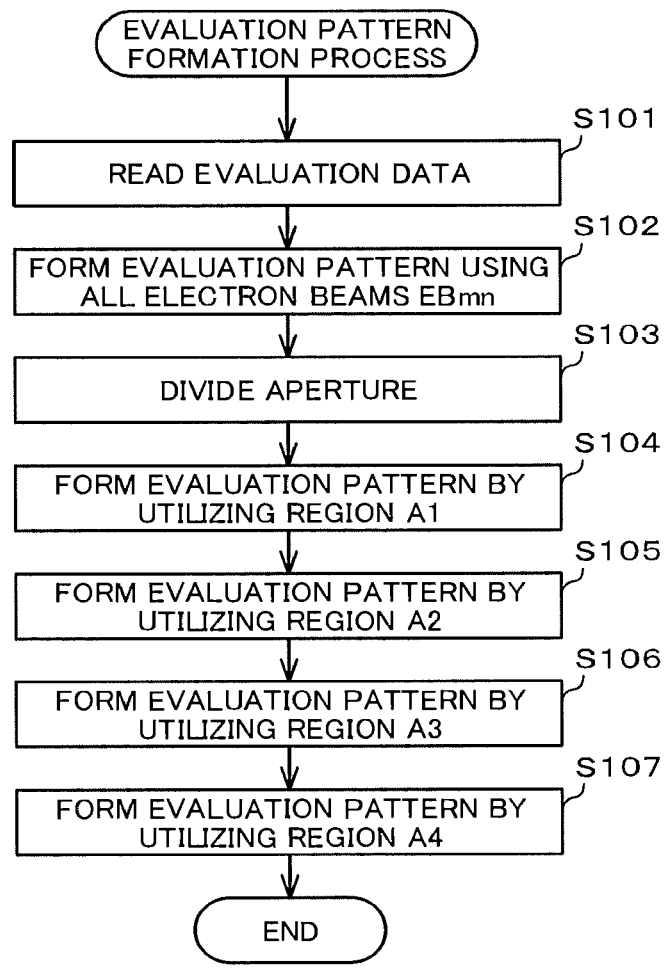
FIG. 7 is a flowchart for an evaluation pattern formation process.

The flowchart in FIG. 7 illustrates sequential processes executed by the CPU 101a in accordance with the program stored in the auxiliary memory 101c. The evaluation pattern formation process is executed along the flowchart in FIG. 7. This evaluation pattern formation process will be explained below with reference to the flowchart in FIG. 7.

Figure 8:
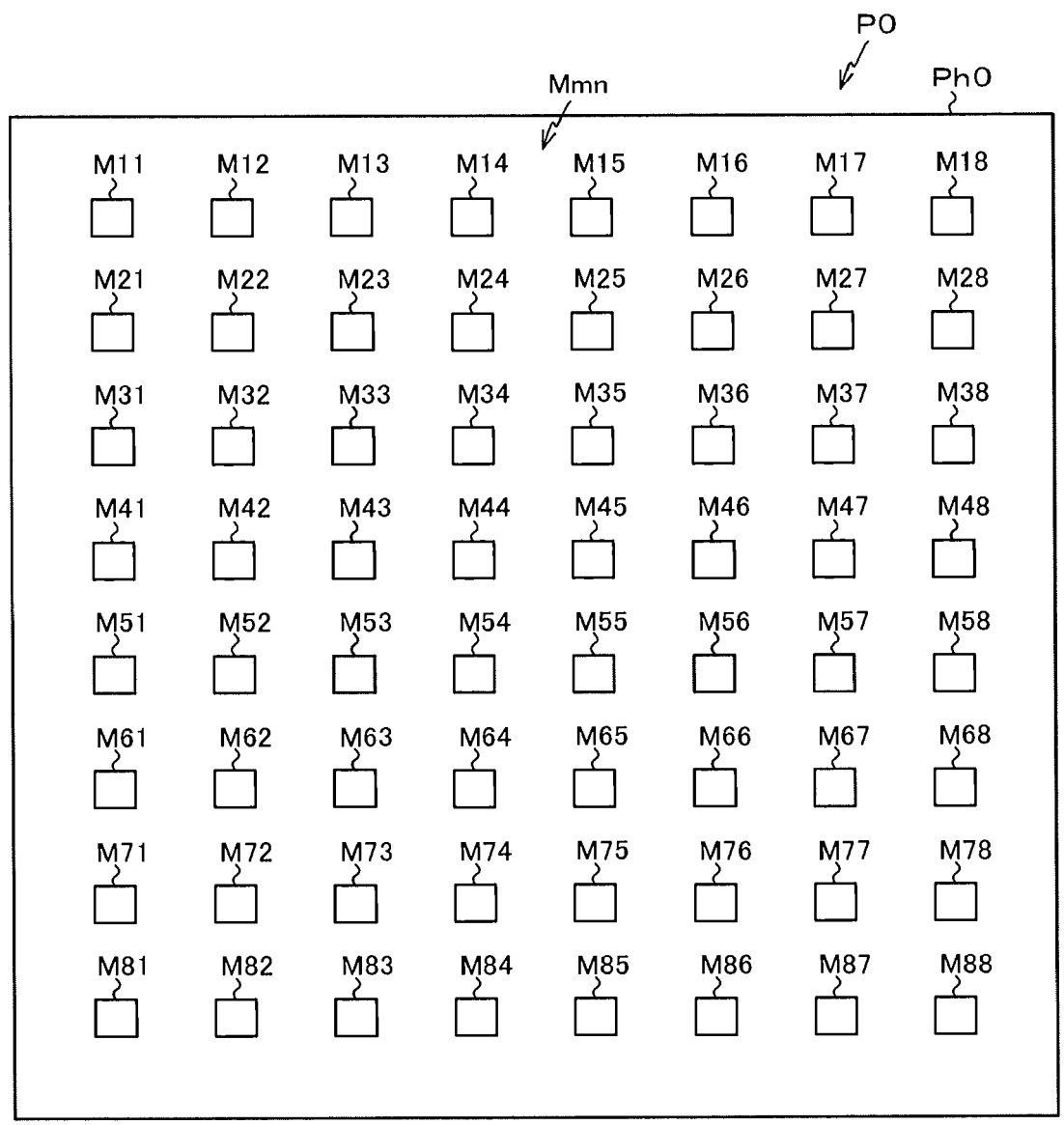
FIG. 8 is a diagram showing an SEM image of an evaluation pattern.

First, the CPU 101a reads (step S101) the evaluation data stored in the auxiliary memory 101c. FIG. 8 is a diagram illustrating a Scanning Electron Microscope (SEM) image Ph0 of an evaluation pattern P0 formed based on the evaluation data. The evaluation data is to form the evaluation pattern P0 including, for example, as illustrated in FIG. 8, square markings Mmn in an eight-by-eight matrix arrangement. Each marking Mmn corresponds to each opening Hmn of the aperture 51 illustrated in FIG. 2.

According to the electron beam lithography system 10, as illustrated in FIG. 1, a cross-over point of the electron beams EBmn is present between the electron gun 30 and the sample 120. Hence, the arrangement of the markings Mmn in the evaluation pattern P0 becomes symmetrical in the X-axis direction and in the Y-axis direction relative to the arrangement of the openings Hmn of the aperture 51 illustrated in FIG. 2. That is, as illustrated in FIG. 8, the markings M11-M18 formed by the electron beams EB11-EB18 having passed through the openings H11-H18 located at the most +Y side and arranged in sequence in the +X-axis direction are located at the most −Y side and arranged in sequence in the −X-axis direction. In FIG. 8, for the purpose of explanation, the XY coordinate system is turned over by 180 degrees, and the arrangement of the markings Mmn appears so as to be aligned with the arrangement of the openings Hmn in FIG. 2. The markings M21-M28 formed by the electron beams EB21-EB28 having passed through the openings H21-H28 are disposed at the +Y side relative to the markings M11-M18. Likewise, the markings M31-M38, the markings M41-M48, the markings M51-M58, the markings M61-M68, the markings M71-M78, and the markings M81-M88 are also arranged at the +Y side in sequence.

Hence, in this embodiment, the first marking at the most −Y side in the first row is indicated as M1n. In addition, the markings in the second to eighth rows are indicated as markings M2n to M8n. Still further, the first marking at the most +X side in the first column is indicated as Mm1. Yet still further, the markings in the second to eighth columns are indicated as Mm2 to Mm8.

Next, the CPU 101a forms (step S102) the evaluation pattern P0 using all electron beams EBmn having passed through the aperture 51 without any blanking on the electron beam EBmn. In this case, the single electron beam EBmn forms the single marking Mmn. In addition, the emission time of each electron beam EBmn entering the sample 120 when the marking Mmn is formed is a constant value that is Td0.

While the pattern is being formed, when it is assumed that there would be no formation error, etc., and when the shape of the opening Hmn of the aperture 51 and the dimension thereof are as originally designed, as illustrated in FIG. 8, the respective markings Mmn in the evaluation pattern P0 have the same size relative to each other, and are arranged at a predetermined pitch. This is because when there is no variability in the shape, etc., of the opening Hmn of the aperture 51, the dose amount of each electron beam EBmn becomes constant that is $f(Td0)mc/cm^2$. When, however, there is a variability in, for example, the area of the opening of the aperture 51, the size of the marking Mmn and the shape thereof vary.

Figure 9:
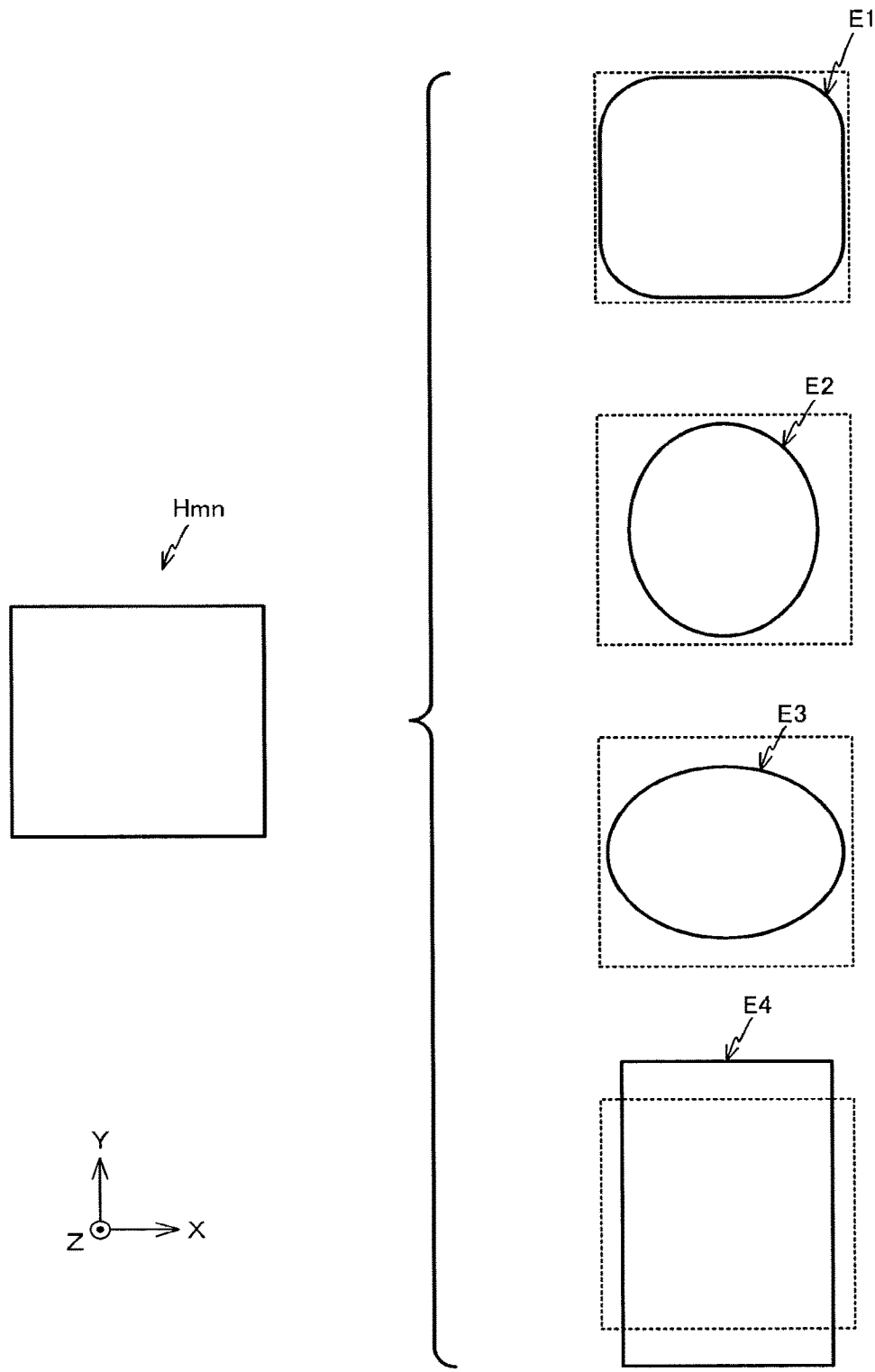
FIG. 9 is a diagram for explaining the opening shape of an aperture.
Figure 10:
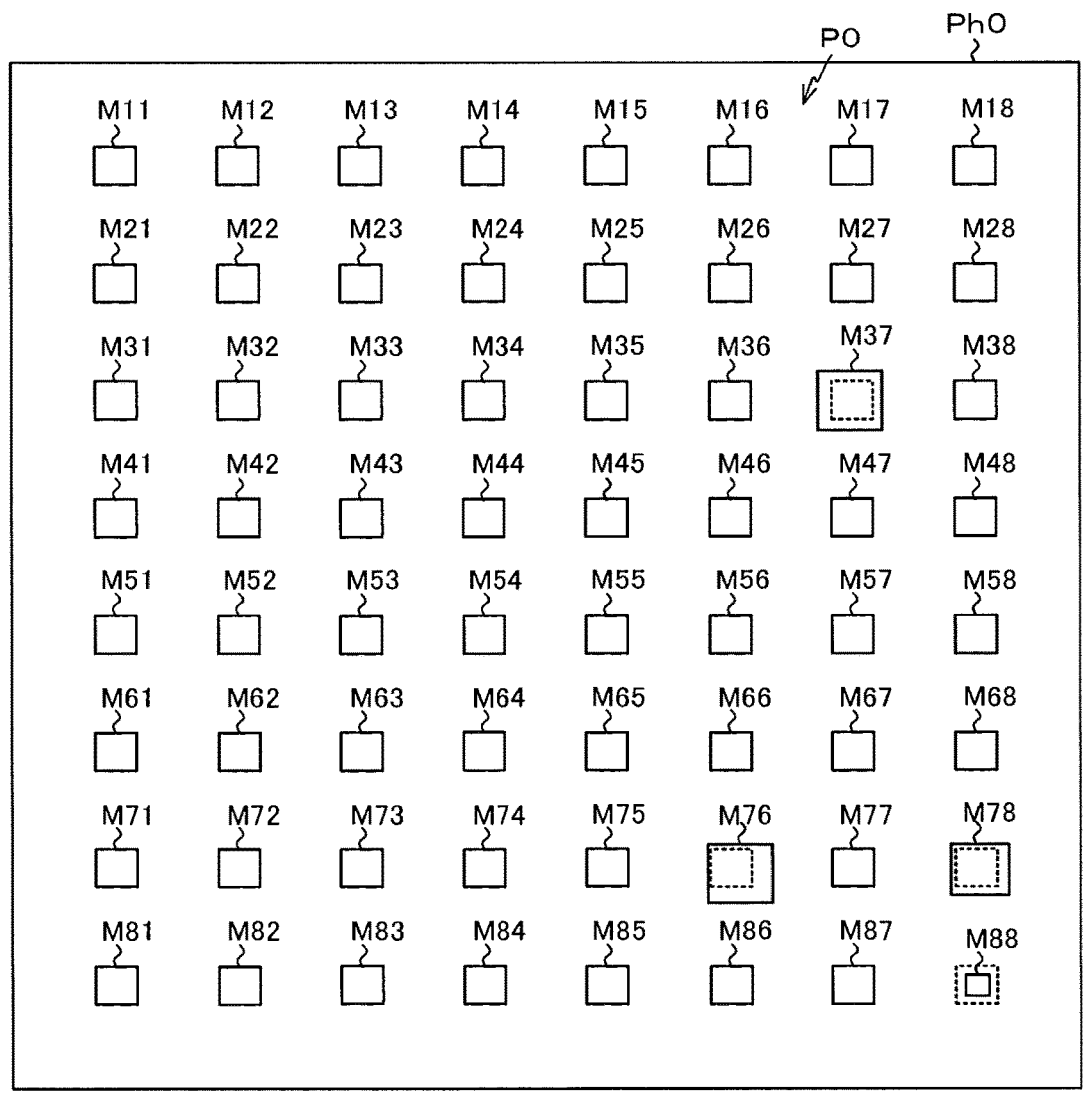
FIG. 10 is a diagram showing an SEM image of an evaluation pattern.

For example, as illustrated in FIG. 9, the opening Hmn finished as originally designed is in a rectangular shape. When, however, the thickness of the plating layer on the surface of the aperture 51 is uneven, and there is process error for the base material of the aperture 51, like example openings E1-E4, the shape of the opening may become elliptical or the size of the opening may differ from the value in the design. When such openings E1-E4 are formed in the aperture 51, the dose amount of each electron beam EBmn varies, and like the evaluation pattern P0 shown by the SEM image Ph0 in FIG. 10, markings M37, M76, and M78 with a larger area than those of the other markings may be formed, or a marking M88 with a smaller area than those of the other markings may be formed.

Figure 11:
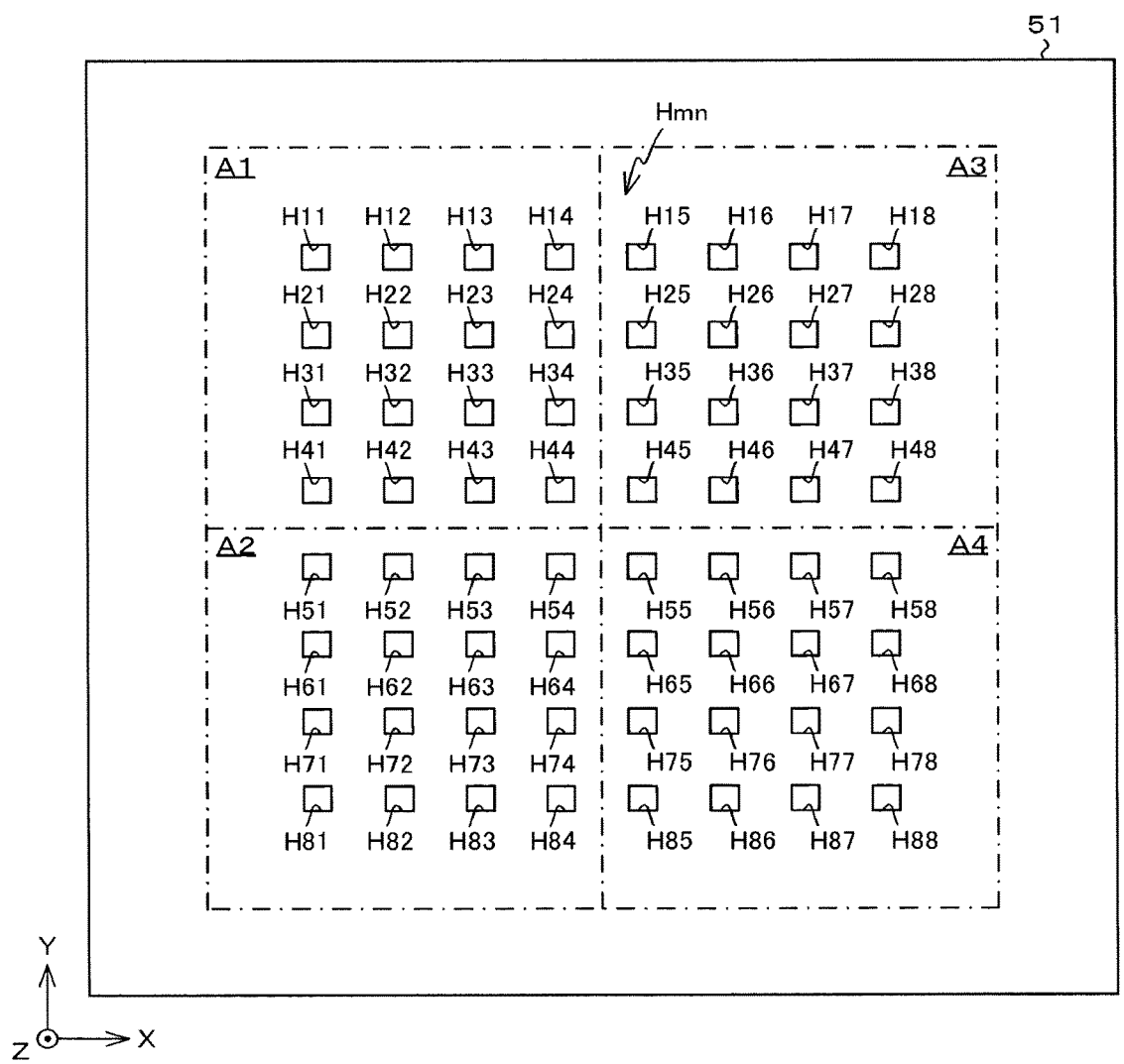
FIG. 11 is a diagram illustrating a region defined in the aperture.

Next, as illustrated in FIG. 11, the CPU 101a divides (step S103) the aperture 51 in the multiple regions. The aperture 51 is formed with the 64 openings Hmn. Hence, the aperture 51 is divided into four regions A1-A4 each of which contain the 16 openings Hmn.

As illustrated in FIG. 11, a region A1 includes the openings H11-H14, H21-H24, H31-H34, and H41-H44. A region A2 includes the openings H51-H54, H61-H64, H71-H74, and H81-H84. A region A3 includes the openings H15-H18, H25-H28, H35-H38, and H45-H48. A region A4 includes the openings H55-H58, H65-H68, H75-H78, and H85-H88.

Subsequently, the CPU 101a forms (step S104) the evaluation pattern by utilizing the region A1 of the aperture 51. In order to form the evaluation pattern by utilizing the region A1, blanking is performed on the electron beams EBmn other than the electron beams EBmn passing through, for example, the openings H11-H14, H21-H24, H31-H34, and H41-H44. Next, the CPU 101a forms an evaluation pattern P1 based on the evaluation data using the 16 electron beams EB11-EB14, EB21-EB24, EB31-EB34, and EB41-EB44. The evaluation pattern P1 is based on the evaluation data that defines the evaluation pattern P0. Hence, ideally, the markings forming the evaluation pattern P1 have the same size as those of the markings in the evaluation pattern P0, and are arranged at the same pitch.

Figure 12:
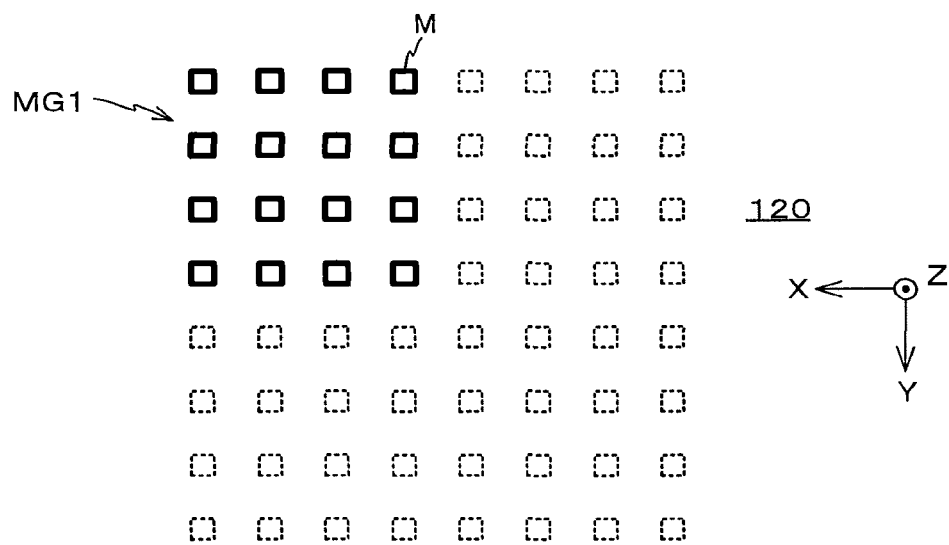
FIG. 12 is a diagram for explaining a formation procedure of an evaluation pattern.

In order to form the evaluation pattern P1, as illustrated in FIG. 12, first, a marking group MG1 including the 16 markings in a four-by-four matrix arrangement is formed. In this case, the respective markings are simultaneously formed using the 16 electron beams EB11-EB14, EB21-EB24, EB31-EB34, and EB41-EB44.

Figure 13:
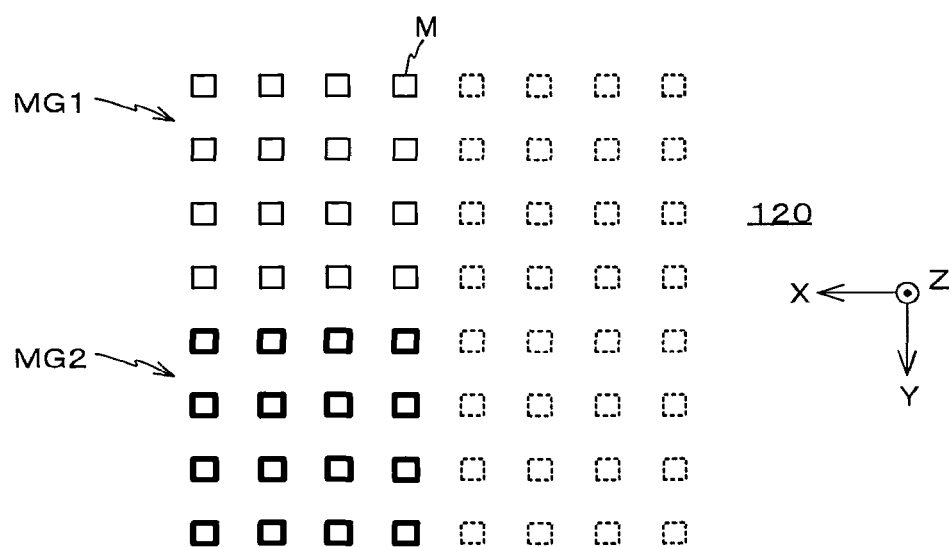
FIG. 13 is a diagram for explaining a formation procedure of the evaluation pattern.
Figure 14:
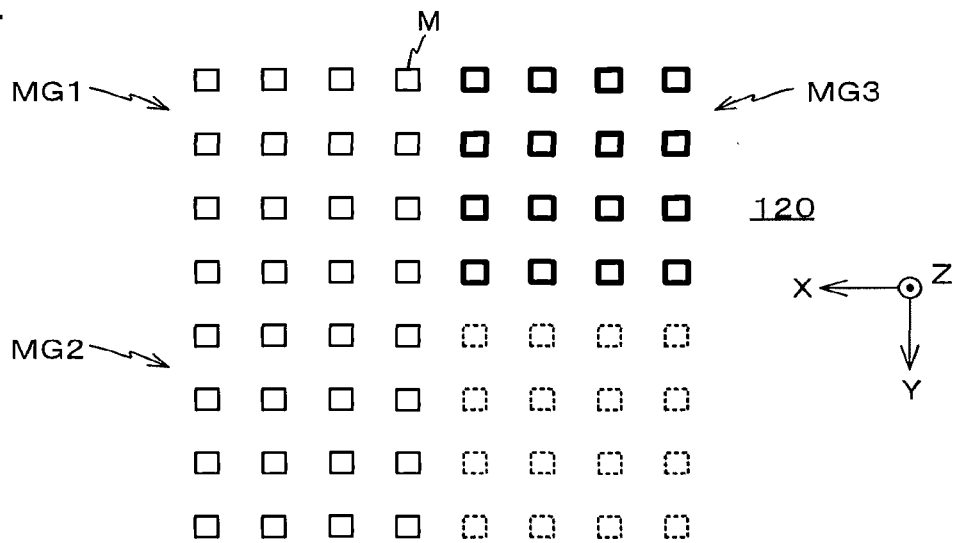
FIG. 14 is a diagram for explaining a formation procedure of the evaluation pattern.
Figure 15:
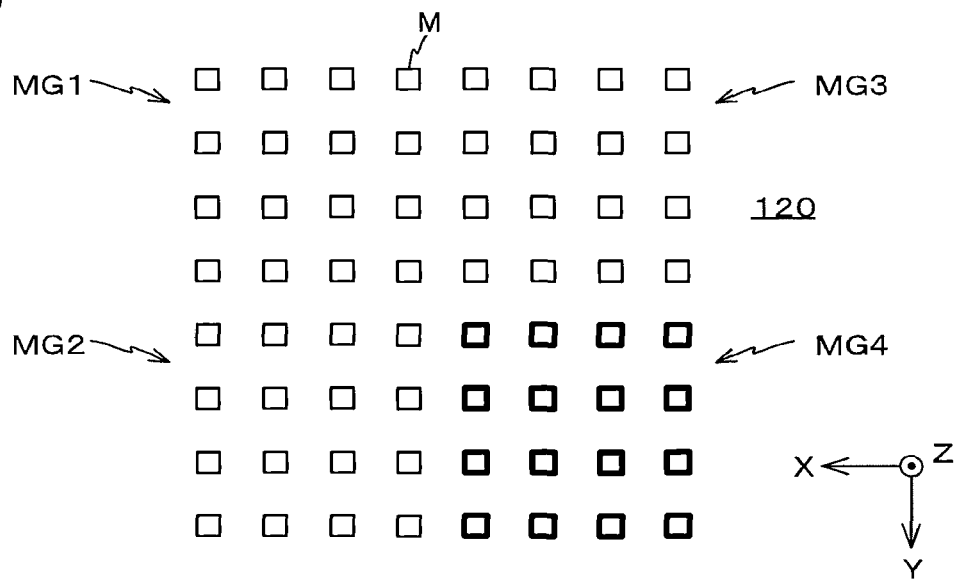
FIG. 15 is a diagram for explaining a formation procedure of the evaluation pattern.

Like the similar scheme, as illustrated in FIG. 13, a marking group MG2 is formed at the +Y side relative to the marking group MG1, and as illustrated in FIG. 14, a marking group MG3 is formed at the −X side relative to the marking group MG1. In addition, as illustrated in FIG. 15, a marking group MG4 is formed at the −X side relative to the marking group MG2.

Figure 16:
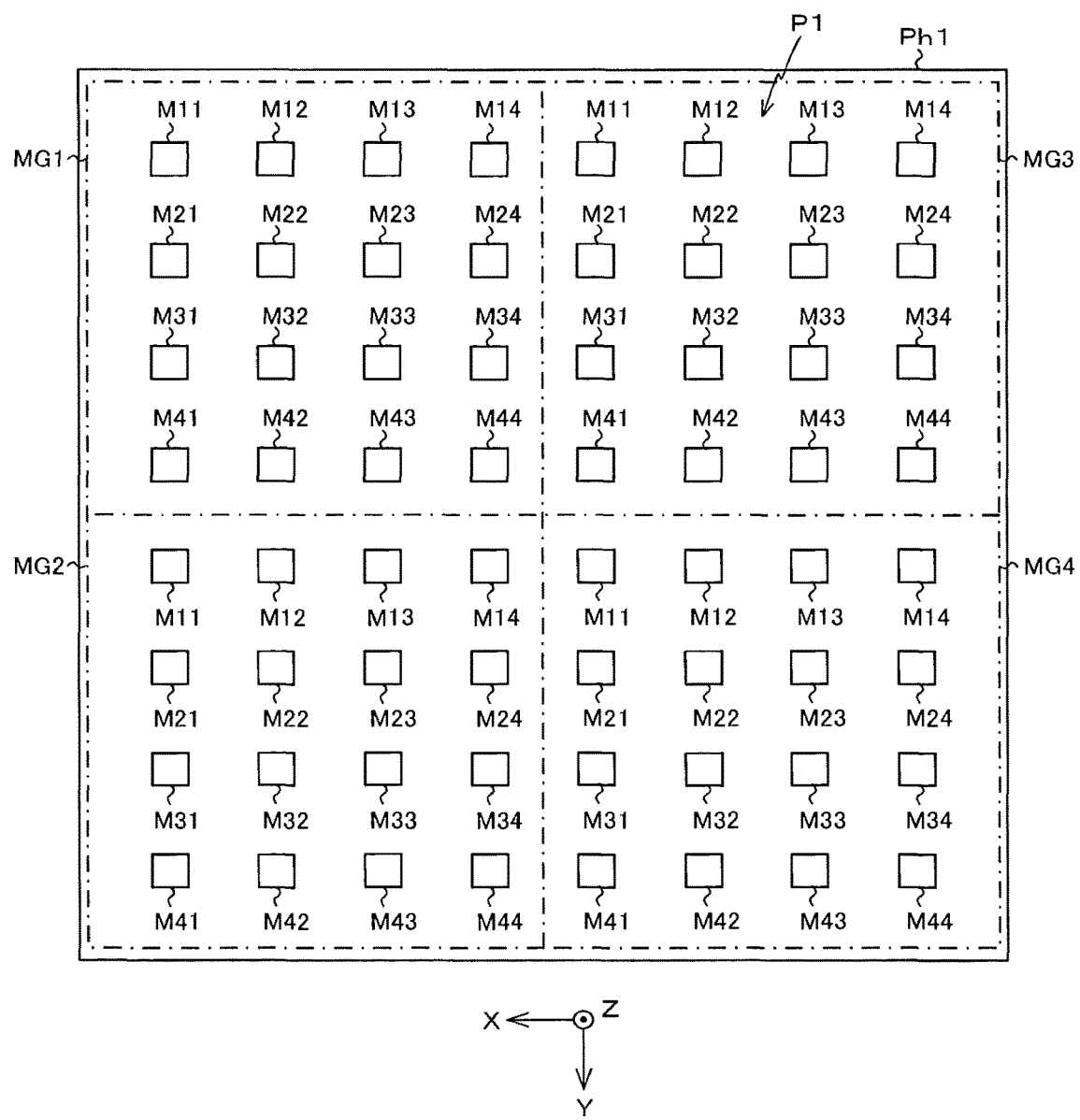
FIG. 16 is a diagram showing an SEM image of an evaluation pattern.

FIG. 16 is a diagram illustrating an SEM image Ph1 of the evaluation pattern P1. As illustrated in FIG. 16, by forming the marking groups MG1-MG4 as explained above, the evaluation pattern P1 including the marking groups MG1-MG4 is formed. In the evaluation pattern P1, each marking group MG1-MG4 includes the 16 markings M11-M14, M21-M24, M31-M34, and M41-M44 formed by the electron beams EB11-EB14, EB21-EB24, EB31-EB34, and EB41-EB44, respectively.

Next, the CPU 101a forms (step S105) the evaluation pattern by utilizing the region A2 of the aperture 51. In order to form the evaluation pattern by utilizing the region A2, blanking is performed on the electron beams EBmn other than the electron beams EBmn passing through, for example, the openings H51-H54, H61-H64, H71-H74, and H81-H84. Next, like the formation of the evaluation pattern P1, the CPU 101a forms an evaluation pattern P2 based on the evaluation data using the 16 electron beams EB51-EB54, EB61-EB64, EB71-EB74, and EB81-EB84.

Figure 17:
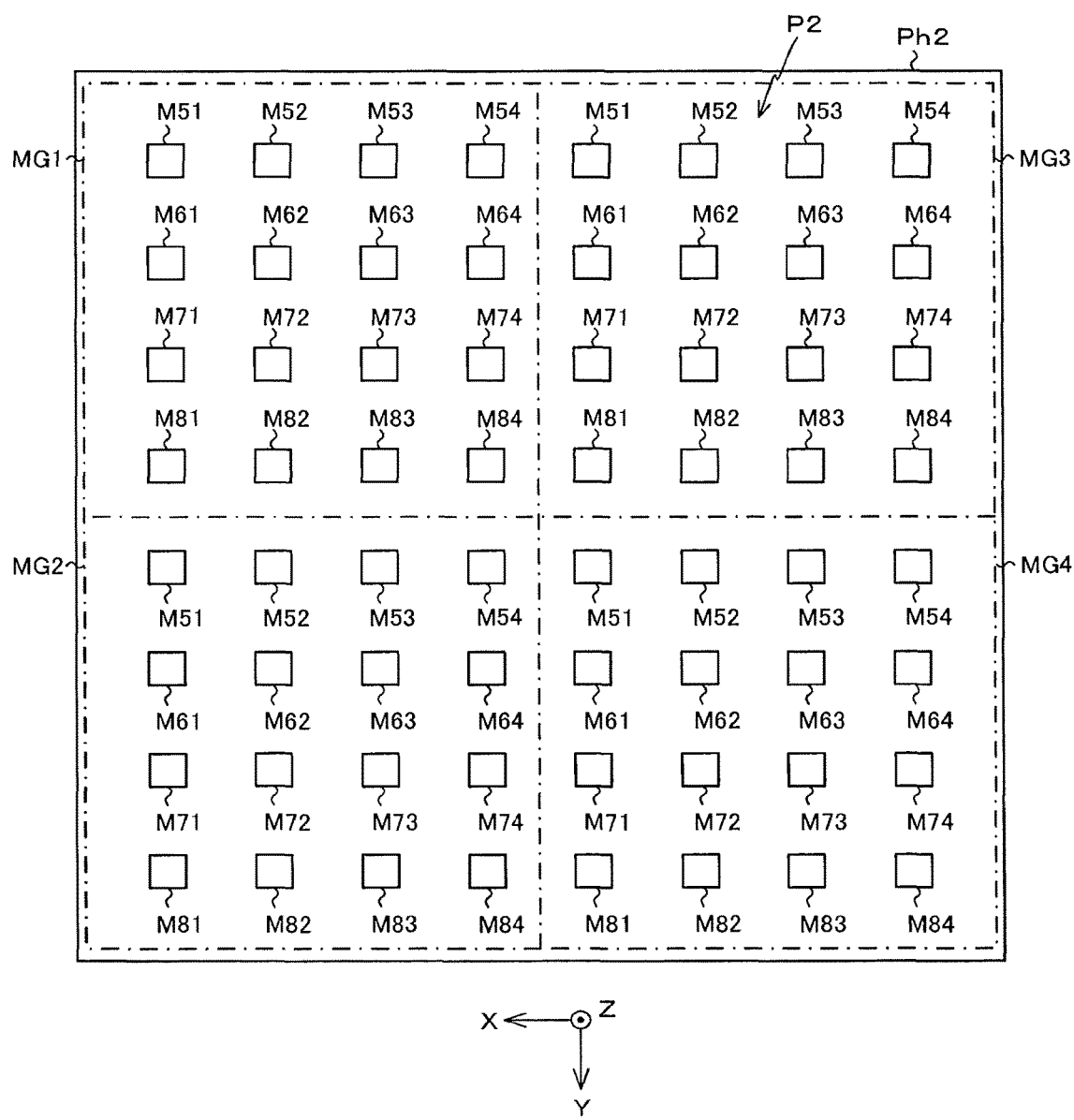
FIG. 17 is a diagram showing an SEM image of the evaluation pattern.

FIG. 17 is a diagram illustrating an SEM image Ph2 of the evaluation pattern P2. As illustrated in FIG. 17, by forming the marking groups MG1-MG4 through the above scheme, the evaluation pattern P2 including the marking groups MG1-MG4 is formed. In the evaluation pattern P2, each marking group MG1-MG4 includes the 16 markings M51-M54, M61-M64, M71-M74, and M81-M84 formed by the electron beams EB51-EB54, EB61-EB64, EB71-EB74, and EB81-EB84, respectively.

Subsequently, the CPU 101*a* forms (step S106) the evaluation pattern by utilizing the region A3 of the aperture 51. In order to form the evaluation pattern by utilizing the region A3, blanking is performed on the electron beams EBmn other than the electron beams EBmn passing through, for example, the openings H15-H18, H25-H28, H35-H38, and H45-H48. Next, like the formation of the evaluation patterns P1, P2, the CPU 101*a* forms an evaluation pattern P3 based on the evaluation data using the 16 electron beams EB15-EB18, EB25-EB28, EB35-EB38, and EB45-EB48.

Figure 18:
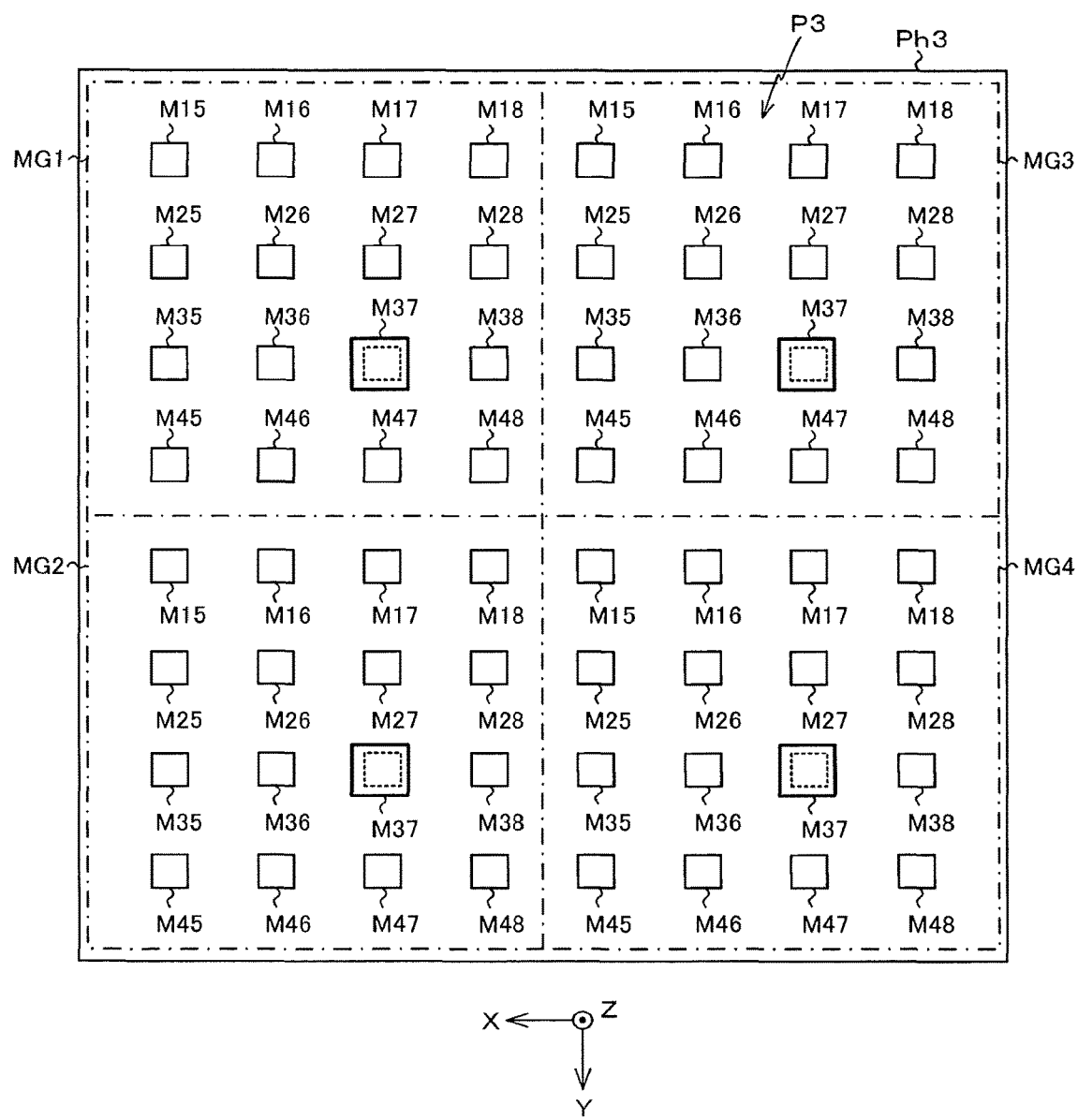
FIG. 18 is a diagram showing an SEM image of the evaluation pattern.

FIG. 18 is a diagram illustrating an SEM image Ph3 of the evaluation pattern P3. As illustrated in FIG. 18, by forming the marking groups MG1-MG4 through the above scheme, the evaluation pattern P3 including the marking groups MG1-MG4 is formed. In the evaluation pattern P3, each marking group MG1-MG4 includes the 16 markings M15-M18, M25-M28, M35-M38, and M45-M48 formed by the electron beams EB15-EB18, EB25-EB28, EB35-EB38, and EB45-EB48, respectively.

Next, the CPU 101*a* forms (step S107) the evaluation pattern by utilizing the region A4 of the aperture 51. In order to form the evaluation pattern by utilizing the region A4, blanking is performed on the electron beams EBmn other than the electron beams EBmn passing through, for example, the openings H55-H58, H65-H68, H75-H78, and H85-H88. Next, like the formation of the evaluation patterns P1, P2, and P3, the CPU 101*a* forms an evaluation pattern P4 based on the evaluation data using the 16 electron beams EB55-EB58, EB65-EB68, EB75-EB78, and EB85-EB88.

Figure 19:
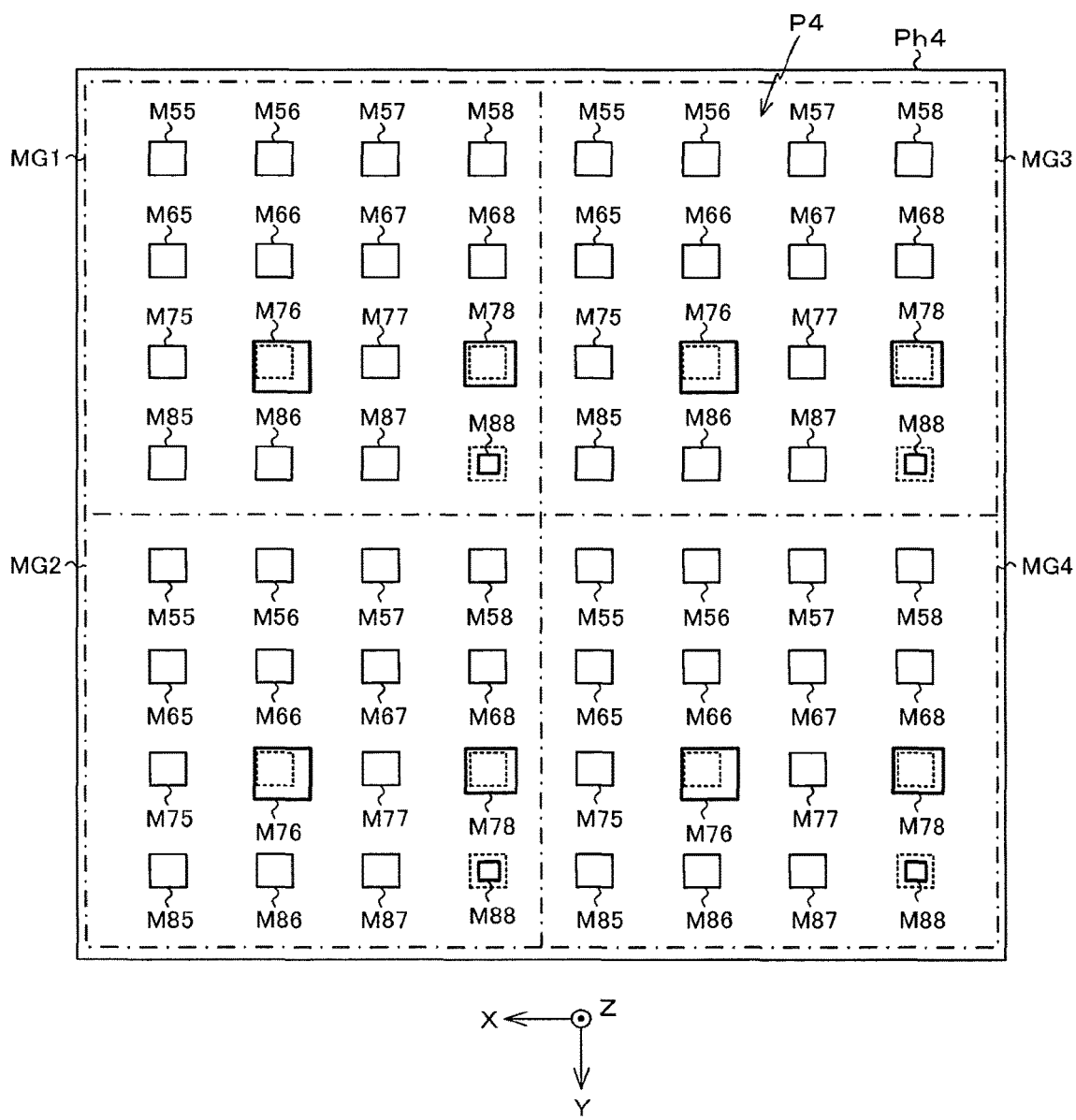
FIG. 19 is a diagram showing an SEM image of the evaluation pattern.

FIG. 19 is a diagram illustrating an SEM image Ph4 of the evaluation pattern P4. As illustrated in FIG. 19, by forming the marking groups MG1-MG4 through the above scheme, the evaluation pattern P4 including the marking groups MG1-MG4 is formed. In the evaluation pattern P4, each marking group MG1-MG4 includes the 16 markings M55-M58, M65-M68, M75-M78, and M85-M88 formed by the electron beams EB55-EB58, EB65-EB68, EB75-EB78, and EB85-EB88, respectively.

When completing the formation of the evaluation patterns P0-P4, the CPU 101*a* ends the evaluation pattern formation process. Upon completion of the evaluation pattern formation process, the evaluation patterns P0-P4 have been formed on the sample 120.

<<Evaluation Process>>

Next, an explanation will be given of an evaluation process of evaluating the precision of the aperture 51 using the evaluation patterns P0-P4 having been formed on the sample 120. The evaluation process is to evaluate the precision of the aperture 51 based on the respective SEM images of the evaluation patterns P0-P4. This evaluation process is executed by, for example, the CPU 101*a* of the controller 101.

Respective SEM images Ph0-Ph4 of the evaluation patterns P0-P4 applied for the evaluation process are obtainable by a device like an SEM that picks up images of the evaluation patterns P0-P4 formed on the sample 120. Those SEM images Ph0-Ph4 are stored in the auxiliary memory 101*c* of the controller 101 beforehand.

Figure 20:
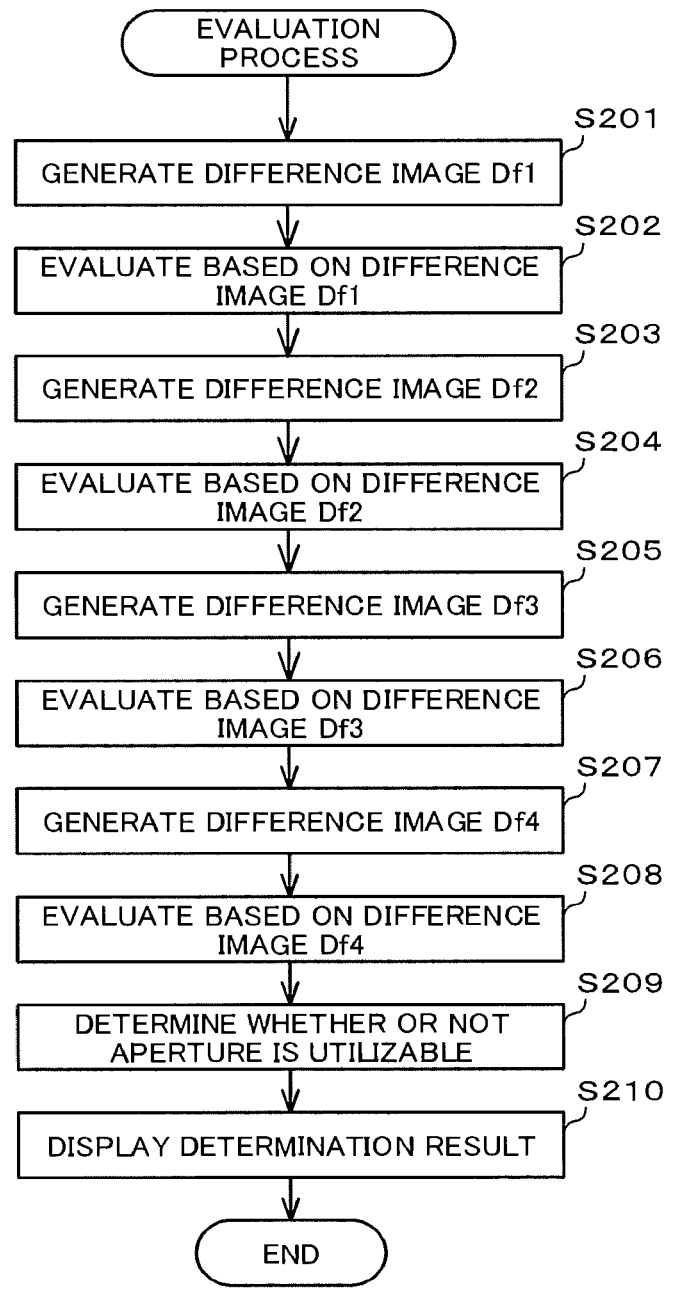
FIG. 20 is a flowchart for an evaluation process.

The flowchart in FIG. 20 illustrates sequential processes executed by the CPU 101*a* in accordance with the program stored in the auxiliary memory 101*c*. The evaluation process is executed along the flowchart in FIG. 20. This evaluation process will be explained below with reference to the flowchart in FIG. 20.

First, the CPU 101*a* reads the SEM images Ph0, Ph1 stored in the auxiliary memory 101*c*. Next, the CPU 101*a* compares the SEM image Ph0 with the SEM image Ph1, and generates (step S201) a difference image Df1.

As for the comparison of the SEM images, first, the CPU 101*a* performs matching on the SEM images Ph0 and Ph1. As for the matching of the SEM images, the SEM image Ph1 is moved relative to the SEM image Ph0, and the normalized mutual correlation of the SEM image Ph1 is calculated. Next, the SEM image Ph0 is laid over on the SEM image Ph1 based on the normalized mutual correlation. In this state, the 64 markings in the SEM image Ph0 precisely overlap the 64 markings in the SEM image Ph1. Next, the CPU 101*a* generates the difference image Df1 between the SEM image Ph0 and the SEM image Ph1. Although the SEM image is a monochrome image, the difference image Df1 may be binarized as needed.

Figure 21:
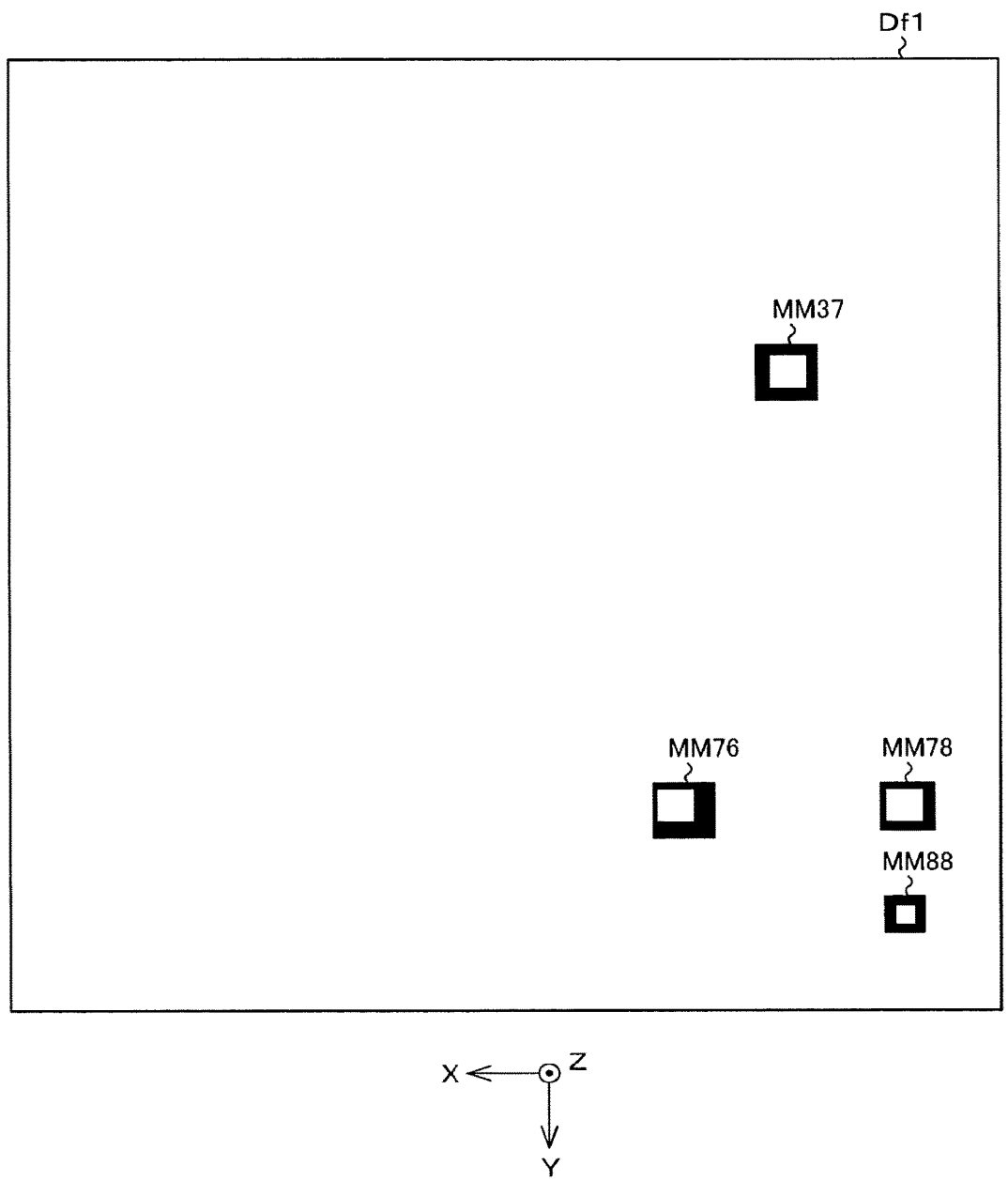
FIG. 21 is a diagram illustrating a difference image.

FIG. 21 is a diagram illustrating the difference image Df1. When the size of the image of the marking in the SEM image Ph0 differs from that of the image of the marking in the SEM image Ph1, for example, markings MM37, MM76, MM78, and MM88 appear in the difference image Df1. The areas of those markings MM37, MM76, MM78, and MM88 indicate a difference in area between the marking in the SEM image Ph0 and the marking in the SEM Ph1 corresponding to each other.

Next, the CPU 101*a* evaluates (step S202) the aperture 51 based on the difference image Df1.

Figure 22:
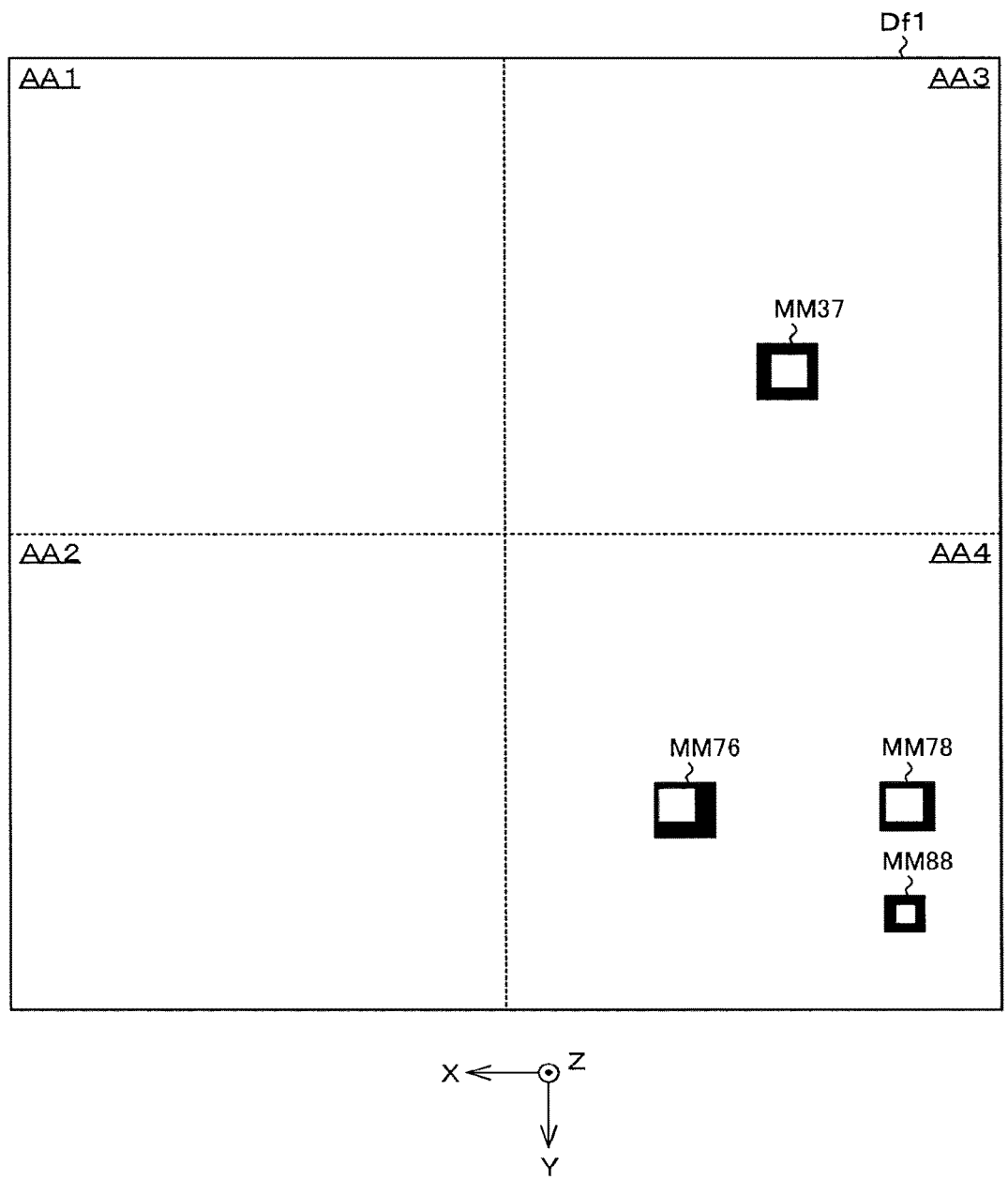
FIG. 22 is a diagram illustrating a region defined in the difference image.

As for the evaluation on the aperture 51, as illustrated in FIG. 22, the CPU 101*a* equally divides the difference image Df1 into four pieces by parallel lines to the Y-axis direction and the X-axis direction and passing through the center of the difference image Df1, and defines four regions AA1-AA4. Respective positions of the regions AA1-AA4 correspond to the regions A1-A4 of the aperture 51 illustrated in FIG. 11. Subsequently, the CPU 101*a* calculates total values AT1-AT4 of the areas of the markings for the respective regions AA1-AA4.

For example, in the example case illustrated in FIG. 22, the total values AT1, AT2 for the respective regions AA1, AA2 where no marking is present become substantially zero, but the total values AT3, AT4 for the respective regions AA3, AA4 where the markings are present become equal to or greater than zero. Hence, the CPU 101*a* compares the respective total values AT1-AT4 with a preset threshold Th. Next, the region that has the total value AT1-AT4 which is equal to or greater than the threshold is specified as a defective region. When, for example, the total values AT3, AT4 are equal to or greater than a threshold Th1, the regions AA3, AA4 are specified as the defective regions. Note that the threshold Th can be set as appropriate in accordance with the specification of the electron beam lithography system 10, and the purpose thereof.

The evaluation pattern P0 shown in the SEM image Ph0 that is a source of the difference image Df1 is formed by the 64 electron beams EBmn. In addition, the evaluation pattern P1 shown in the SEM image Ph1 is formed by the 16 electron beams EB11-EB14, EB21-EB24, EB31-EB34, and EB41-EB44 in the 64 electron beams EBmn. Hence, in general, no marking M appears in the region AA1 in the difference image Df1.

Hence, according to the evaluation based on the difference image Df1, the spot shape of the electron beam EBmn that has passed through the region A1 of the aperture 51 is compared with the spot shapes of the electron beams EBmn that have passed through the regions A2-A4 of the aperture 51. Accordingly, in the evaluation based on the difference image Df1, the evaluation on the aperture 51 is made based on the deviation between the opening Hmn formed in the region A1 of the aperture 51 and the openings Hmn formed in the regions A2, A3, and A4.

Next, the CPU 101a reads the SEM images Ph0, Ph2 stored in the auxiliary memory 101c. Subsequently, the CPU 101a likewise compares the SEM image Ph0 with the SEM image Ph2, and generates (step S203) a difference image Df2.

Next, the CPU 101a evaluates (step S204) the aperture 51 based on the difference image Df2. Hence, the evaluation on the aperture 51 is made based on the deviation between the opening Hmn formed in the region A2 of the aperture 51 with the openings Hmn formed in the regions A1, A3, and A4.

Subsequently, the CPU 101a likewise compares the SEM image Ph0 with the SEM image Ph3, and generates (step S205) a difference image Df3. Next, the CPU 101a evaluates (step S206) the aperture 51 based on the difference image Df3. Hence, the evaluation on the aperture 51 is made based on the deviation between the opening Hmn formed in the region A3 of the aperture 51 with the openings Hmn formed in the regions A1, A2, and A4.

Subsequently, the CPU 101a compares the SEM image Ph0 with the SEM image Ph4, and generates (step S207) a difference image Df4. Next, the CPU 101a evaluates (step S208) the aperture 51 based on the difference image Df4. Hence, the evaluation on the aperture 51 is made based on the deviation between the opening Hmn formed in the region A4 of the aperture 51 with the openings Hmn formed in the regions A1, A2, and A3.

Figure 23:
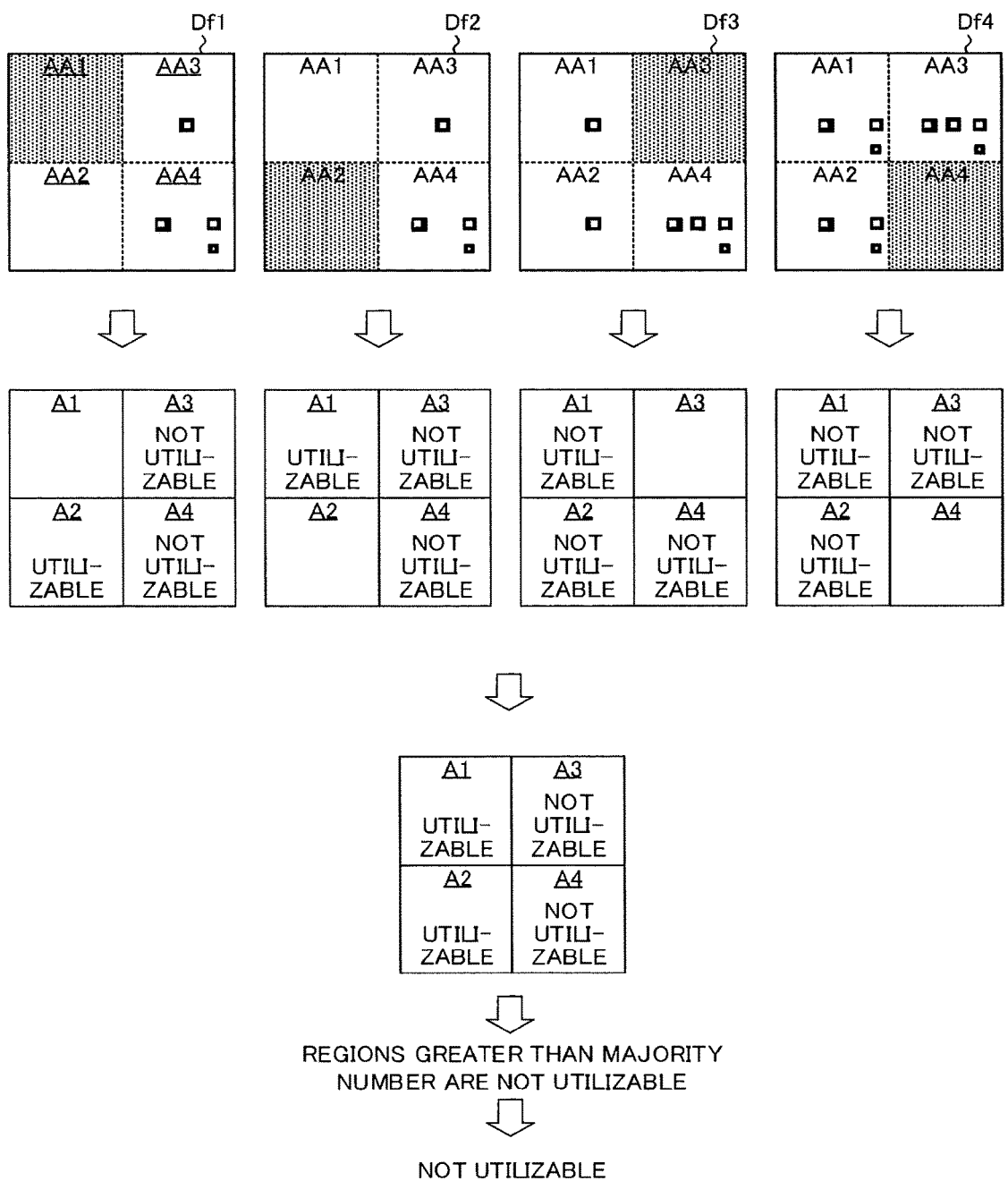
FIG. 23 is a diagram conceptually showing an evaluation based on the difference image.

FIG. 23 is a diagram conceptually showing the evaluation based on the difference images Df1-Df4. As illustrated in FIG. 23, the evaluation results for the respective regions A1-A4 of the aperture 51 corresponding to the regions AA1-AA4 of the respective difference images Df1-Df4 are obtainable by the processes from the step S201 to the step S208.

Next, the CPU 101a determines (step S209) whether or not the aperture 51 is utilizable based on the evaluation results for the regions A1-A4 of the aperture 51.

When the aperture 51 is divided in the four regions A1-A4, evaluation is made for each region by three times. For example, the region A1 is compared with the regions A2-A4, and thus the evaluation is made by three times. The CPU 101a determines the aperture 51 as not utilizable in practice which has the number of regions determined as not utilizable in practice in all three evaluations that is greater than the majority number. In the example case illustrated in FIG. 23, the regions A3, A4 are determined as not utilizable in practice in all three evaluations. Hence, the CPU 101a determines that, for example, the two regions A3, A4 in the four regions A1-A4 are not utilizable in practice, and consequently determines that the aperture 51 is not utilizable in practice.

Upon determination on whether or not the aperture 51 is utilizable in practice, the CPU 101a displays (step S210) the determination result on the display 101e. Upon completion of the process in the step S210, the CPU 101a ends the evaluation process.

This enables the user to replace and carry out a maintenance for the aperture 51 based on the evaluation result for the aperture 51. Depending on the evaluation result, however, by correcting the dose amount of electron beam, the aperture 51 that has been determined as not utilizable in practice can be made utilizable again. An explanation will be given below of a correction process of the dose amount of electron beam.

<<Correction Process>>

Figure 24:
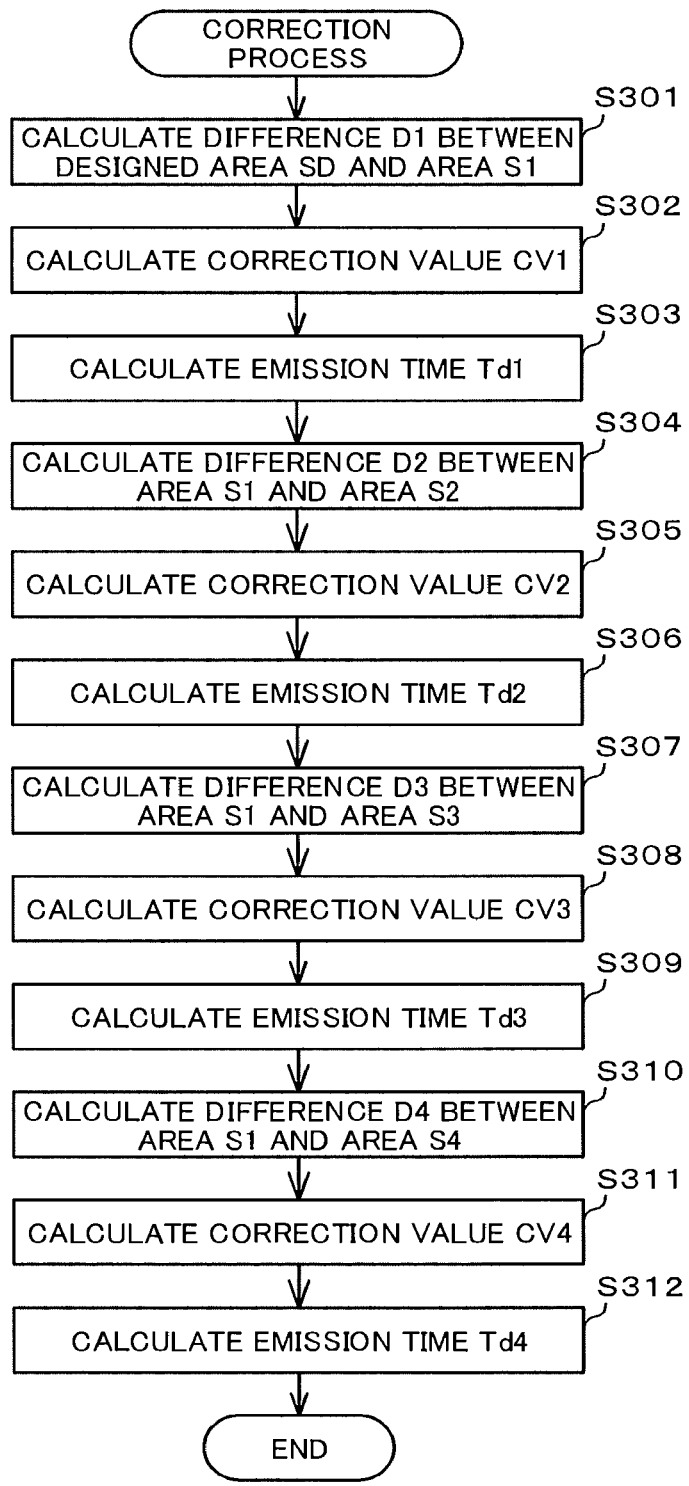
FIG. 24 is a flowchart for a correction process.

The flowchart in FIG. 24 illustrates sequential processes executed by the CPU 101a in accordance with the program stored in the auxiliary memory 101c. The correction process is executed along the flowchart in FIG. 24. The correction process will be explained below with reference to the flowchart in FIG. 24.

First, the CPU 101a calculates (step S301) differences D1(1)-D1(16) between an area SD of the opening Hmn in the aperture 51 in the design and areas S1(1)-S1(16) of the markings M11-M14, M21-M24, M31-M34, and M41-M44 in the SEM image Ph1.

More specifically, first, the CPU 101a reads the SEM image Ph1 from the auxiliary memory 101c. Next, the areas S1(1)-S1(16) of the markings M11-M14, M21-M24, M31-M34, and M41-M44 in the SEM image Ph1 are calculated. Subsequently, an area S1(i) is subtracted from the area SD in the design. Note that i is an integer between 1 to 16, and the differences D1(1)-D1(16) can be expressed by the following formula (1).

$$D1(i) = SD - S1(i) \tag{1}$$

Next, the CPU 101a calculates (step S302) correction values CV1(1)-CV1(16) for the emission times of the respective electron beams EB11-EB14, EB21-EB24, EB31-EB34, and EB41-EB44 based on the differences D1(1)-D1(16).

When the area of the aperture Hmn of the aperture 51 in the design is SD, and when the electron beam EBmn is emitted by a time Td0, a dose amount V becomes a proportional value to the product of the area SD of the opening by the time Td0 (=SD×Td0). Hence, when a target emission time is defined as Td0, a correction value CV1(i) is obtainable from the following formula (2).

$$CV1(i) = Td0 \times (SD - S1(i))/S1(i) \tag{2}$$
$$= Td0 \times D1(i)/S1(i)$$

Next, the CPU 101a calculates (step S303) respective emission times Td1(i) of the electron beams EB11-EB14, EB21-EB24, EB31-EB34, and EB41-EB44 having the correction value taken into consideration. The emission time Td1(i) is obtainable from the following formula (3).

$$Td1(i) = Td0 + CV1(i) \tag{3}$$

Subsequently, the CPU 101a reads the SEM images Ph1, Ph2 from the auxiliary memory 101c. Next, the SEM images Ph1, Ph2 are compared with each other to calculate (step S304) differences D2(i) between the areas S1(i) of the markings M11-M14, M21-M24, M31-M34, and M41-M44 in the SEM image Ph1 and areas S2(i) of the markings M51-M54, M61-M64, M71-M74, and M81-M84 in the SEM image Ph2. The difference D2(i) can be expressed by the following formula (4).

$$D2(i) = S1(i) - S2(i) \tag{4}$$

Next, the CPU 101a calculates (step S305) correction values CV2(i) for the emission times of the respective electron beams EB51-EB54, EB61-EB64, EB71-EB74, and EB81-EB84 based on the differences D2($i$). The correction value CV2($i$) is obtainable from the following formula (5).

$$CV2(i)=Td1(i) \times D2(i)/S2(i) \quad (5)$$

Subsequently, the CPU 101*a* calculates (step S306) respective emission times Td2 ($i$) of the electron beams EB51-EB54, EB61-EB64, EB71-EB74, and EB81-EB84 having the correction value taken into consideration. The emission time Td2($i$) is obtainable from the following formula (6).

$$Td2(i)=Td1(i)+CV2(i) \quad (6)$$

Next, the CPU 101*a* reads the SEM images Ph1, Ph3 from the auxiliary memory 101*c*. Subsequently, the SEM images Ph1, Ph3 are compared with each other to calculate (step S307) differences D3($i$) between the areas S1($i$) of the markings M11-M14, M21-M24, M31-M34, and M41-M44 in the SEM image Ph1 and areas S3($i$) of the markings M15-M18, M25-M28, M35-M38, and M45-M48 in the SEM image Ph3. The difference D3($i$) can be expressed by the following formula (7).

$$D3(i)=S1(i)-S3(i) \quad (7)$$

Subsequently, the CPU 101*a* calculates (step S308) correction values CV3($i$) for the emission times of the respective electron beams EB15-EB18, EB25-EB28, EB35-EB38, and EB45-EB48 based on the differences D3($i$). The correction value CV3($i$) is obtainable from the following formula (8).

$$CV3(i)=Td1(i) \times D3(i)/S3(i) \quad (8)$$

Next, the CPU 101*a* calculates (step S309) respective emission times Tdq3($i$) of the electron beams EB15-EB18, EB25-EB28, EB35-EB38, and EB45-EB48 having the correction value taken into consideration. The emission time Td3($i$) is obtainable from the following formula (9).

$$Td3(i)=Td1(i)+CV3(i) \quad (9)$$

Subsequently, the CPU 101*a* reads the SEM images Ph1, Ph4 from the auxiliary memory 101*c*. Next, the SEM images Ph1, Ph4 are compared with each other to calculate (step S310) differences D4 ($i$) between the areas S1($i$) of the markings M11-M14, M21-M24, M31-M34, and M41-M44 in the SEM image Ph1 and areas S4($i$) of the markings M55-M58, M65-M68, M75-M78, and M85-M88 in the SEM image Ph4. The difference D4($i$) can be expressed by the following formula (10).

$$D4(i)=S1(i)-S4(i) \quad (10)$$

Subsequently, the CPU 101*a* calculates (step S311) correction values CV4($i$) for the emission times of the respective electron beams EB55-EB58, EB65-EB68, EB75-EB78, and EB85-EB88 based on the differences D4 ($i$). The correction value CV4 ($i$) is obtainable from the following formula (11).

$$CV4(i)=Td1(i) \times D4(i)/S4(i) \quad (11)$$

Next, the CPU 101*a* calculates (step S312) respective emission times Td4 ($i$) of the electron beams EB55-EB58, EB65-EB68, EB75-EB78, and EB85-EB88 having the correction value taken into consideration. The emission time Td4($i$) is obtainable from the following formula (12).

$$Td4(i)=Td1(i)+CV4(i) \quad (12)$$

The emission times Td1($i$)-TD4($i$) obtained by the processes in the steps S301-S304 can be expressed as follows. That is, the emission time for the region A1 of the aperture 51 becomes a value obtained by adding the designed emission time Td0 defined by a designed value and the correction value CV1($i$) that is obtained from the designed value of the opening Hmn and the actual measured value of the opening Hmn in the region A1. In addition, the emission times for the respective regions A2, A3, and A4 are values obtained by adding the designed emission time Td0 and the correction value CV1($i$), and further the respective correction values CV2($i$), CV3($i$), and CV4($i$) of the apertures Hmn in the regions A2, A3, and A4 relative to the opening Hmn in the region A1.

$$Td1(i) = Td0 + CV1(i)$$
$$Td2(i) = Td1(i) + CV2(i)$$
$$\quad\quad = Td0 + CV1(i) + CV2(i)$$
$$Td3(i) = Td1(i) + CV3(i)$$
$$\quad\quad = Td0 + CV1(i) + CV3(i)$$
$$Td4(i) = Td1(i) + CV4(i)$$
$$\quad\quad = Td0 + CV1(i) + CV4(i)$$

When calculating the respective corrected emission times Td1($i$)-Td4 ($i$) relative to the target emission time Td0 defined by the lithography data for the respective 64 electron beams EBmn, the CPU 101*a* stores the corrected emission times Td1($i$)-Td4($i$) in the auxiliary memory, and ends the correction process.

According to the electron beam lithography system 10, when the pattern is formed, the emission times Td1($i$)-Td4($i$) in accordance with the area of the opening Hmn in the aperture 51 are calculated based on the target emission time Td0 of electron beam defined by the lithography data. Next, the electron beams EBmn are emitted in accordance with those calculated emission times Td1($i$)-Td4($i$), respectively. Hence, even if the size of the openings Hmn in the aperture 51 have a variability, the electron beam EBmn can enter the sample 120 so as to have the dose amount that is on the basis of the designed value.

As explained above, according to this embodiment, the aperture 51 is divided into the multiple regions A1-A4 (step S103). Next, the SEM images Ph1-Ph4 of the evaluation patterns P1-P4 formed by utilizing the respective regions A1-A4 of the aperture 51 are compared with each other (steps S201, S203, S205, and S207), and a determination on whether or not the aperture 51 is utilizable in practice is made based on the comparison results.

Hence, in comparison with a case in which, for example, the individual opening Hmn in the aperture 51 is measured one by one for the area and for the dimension, etc., and a determination on whether or not the aperture is utilizable in practice is made based on the measured results, a determination on whether or not the aperture is utilizable in practice can be made precisely within a quite short time according to this embodiment.

In addition, depending on the determination on whether or not the aperture is utilizable in practice, the utilization of the aperture determined as not utilizable is avoidable. Hence, the electron beam can be precisely split into multiple electron beams by the aperture that has a high process precision, and thus a precise pattern can be formed.

Still further, according to this embodiment, as is clear from FIG. 23, as for the regions A1-A4 of the aperture 51, a determination is made so as to distinguish the region that contains a process error, and the region that has no process error. Hence, the percent defective for the aperture 51 can be grasped. Note that the percent defective is defined by, for example, a ratio (TM2/TM1) of a total number TM1 of the regions and a total number TM2 of the defective regions.

In this embodiment, the evaluation on the aperture 51 is made based on the SEM images Ph0-Ph4 of the evaluation patterns P0-P4 formed on the sample 120. Hence, the evaluation on the aperture 51 can be made without suspending the operation of the electron beam lithography system 10.

In this embodiment, for example, by forming the original pattern on the sample 120 and also the evaluation patterns P0-P4 thereon together, an evaluation for aged deterioration, etc., of the aperture 51 due to contamination, etc., is enabled every time the original pattern is formed.

In this embodiment, the variability in dose amount due to the variability in area of the opening Hmn of the aperture 51 is adjusted through the correction process (steps S301-S312). Hence, a precise pattern can be formed on the sample.

Figure 25:
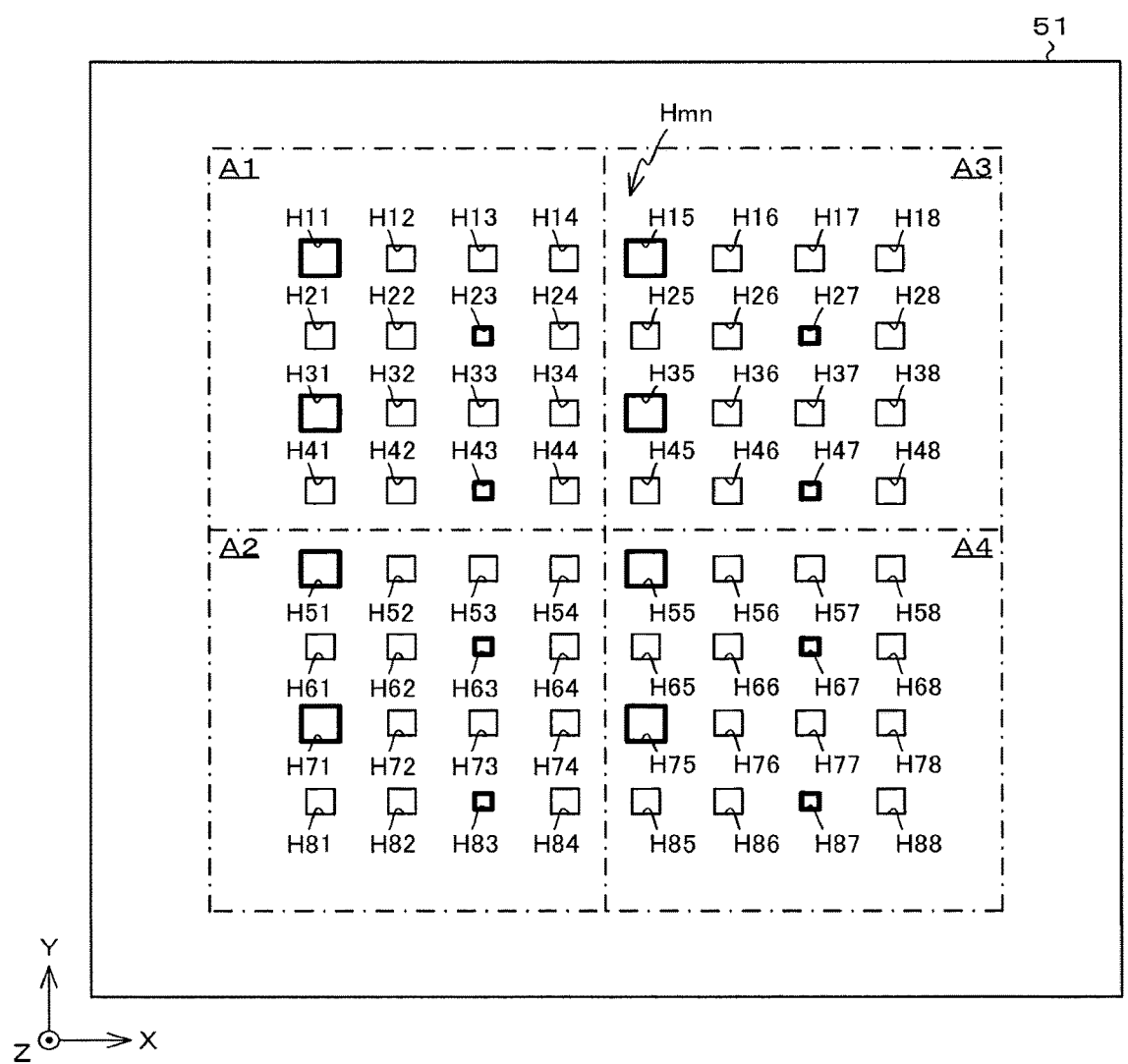
FIG. 25 is a plan view of an aperture.

In this embodiment, for example, as illustrated in FIG. 25, even if the aperture 51 has defective openings that have a remarkably large area, and have a remarkably small area, when the distribution of those defective openings is uniform across the regions A1-A4, such an aperture 51 is determined that all regions A1-A4 are utilizable in practice, and consequently, the aperture 51 is determined as utilizable.

According to this embodiment, however, the correction process is performed on the aperture 51, and thus a precise pattern can be formed even in such a case. In addition, in the correction process, when the emission time in the design quite differs from the emission time having undergone correction, a determination can be made that such an aperture 51 is not utilizable in practice. Hence, a pattern formation by utilizing the aperture 51 that has a low process precision is avoidable.

Figure 26:
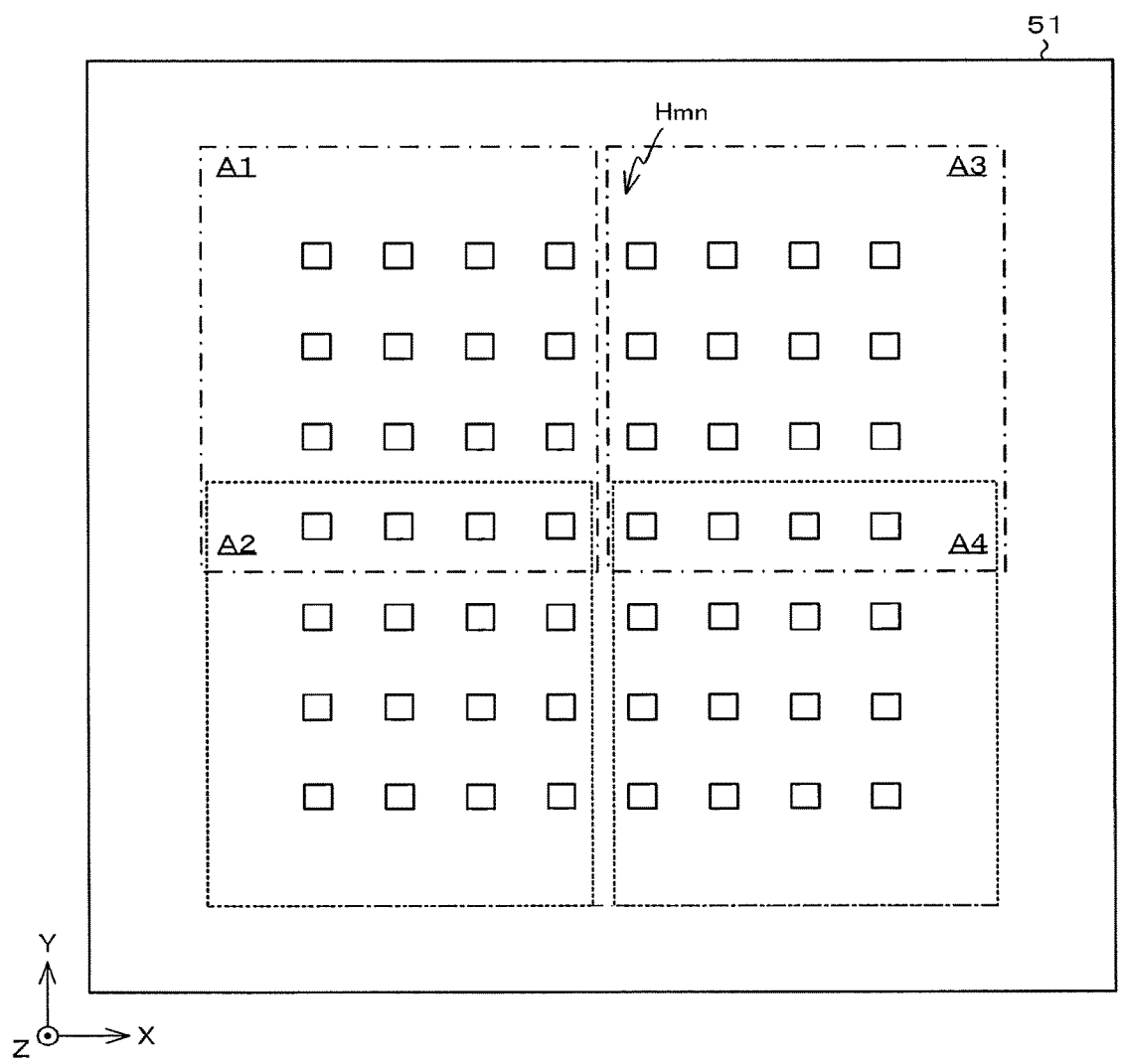
FIG. 26 is a diagram illustrating a region defined in the aperture.

In this embodiment, the explanation has been given of an example case in which the openings are formed in an eight-by-eight matrix arrangement in the aperture 51. However, the arrangement of the openings in the aperture 51 is not limited to this case. In addition, when the openings of the aperture 51 are formed in a matrix arrangement with odd-number rows or odd-number columns, as illustrated in FIG. 26, the aperture 51 may have regions defined so as to partially overlap with each other.

<<Second Embodiment>>

Next, an explanation will be given of a second embodiment. An electron beam lithography system 10 according to the second embodiment differs from that of the first embodiment such that the dose amount due to the shot electron beam is corrected. An explanation will be given of the electron beam lithography system 10 according to the second embodiment with reference to the figures. Note that the same or equivalent component to that of the first embodiment will be denoted by the same reference numeral, and the explanation thereof will be omitted or simplified.

The dose amount of the electron beam EBmn may vary electron beam EBmn by electron beam EBmn. Hence, an error in dose amount may occur among the electron beams EBmn. Accordingly, a process of correcting such an error among the electron beams EBmn is necessary in this case.

The dose amount of the electron beam is proportional to the emission time of the electron beam. Hence, the error in dose amount increases or decreases depending on the response speed of the blanker BKmn, etc. For example, the rising time of the blanking signal output by the blanking amplifier 104 to the blanker BKmn and the falling time thereof are affected by the wiring path and the wiring length up to the blanking amplifier 104, or the wiring route, etc., thereto. Hence, even if the blanking amplifier 104 outputs the blanking signal to each blanker BKmn based on the target dose amount, There may be a difference between the actual dose amount and the target dose amount. Such a difference varies blanker BKmn by blanker BKmn, and thus the error in dose amount occurs among the electron beams EBmn passing through the respective blankers BKmn.

The error in dose amount appears as the difference in size of the marking formed by the electron beam. When, for example, the marking is formed on the sample 120, the electron beam EBmn is emitted to the sample 120 so as to accomplish a target dose amount Tx. In this case, when the rising time of the blanking signal output to the blanker BKmn is long, a time until blanking is performed on the electron beam EBmn becomes long. Hence, when the electron beam EBmn is shot to the sample 120 by multiple times to form the marking, the dose amount exceeds the target dose amount Tx, resulting in an increase in the size of the formed marking.

Conversely, when the falling time of the blanking signal output to the blanker BKmn is long, a time until emission of the electron beam EBmn to the sample 120 starts becomes long. Hence, when the electron beam EBmn is shot to the sample 120 by multiple times to form the marking, the dose amount becomes smaller than the target dose amount Tx, resulting in a decrease in the size of the formed marking.

As explained above, as for the electron beam EBmn, when a delay time Ts of the emission start time and a delay time Te of the emission end time are large, the dose amount per a shot increases or decreases. Consequently, the size of the formed marking varies.

Figure 27:
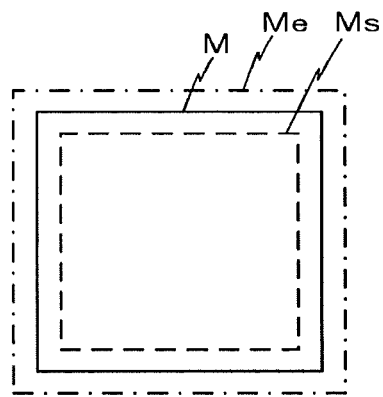
FIG. 27 is a diagram illustrating a marking formed on a sample.
Figure 27:
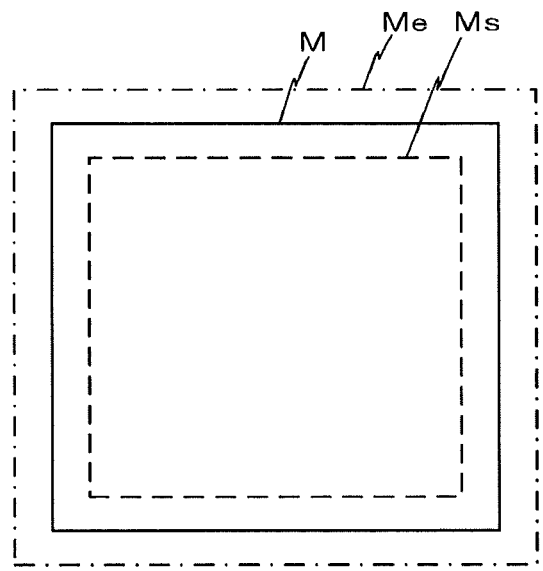
Figure 27:
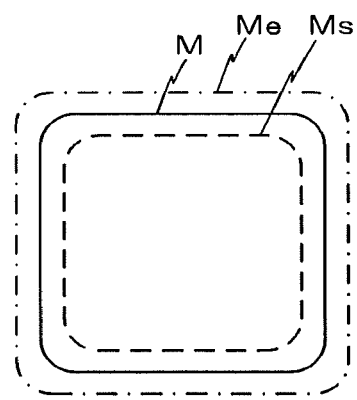

FIG. 27 illustrates a marking M formed on the sample 120. The marking M indicated by a continuous line represents the marking formed by the electron beam EBmn shot by one time. As for the marking M formed by the electron beam shot by one time, since the rates of the delay times Ts, Te relative to the emission time are small, the dose amount of the marking M is close to the target dose amount Tx.

Conversely, the marking formed by the electron beam shot by multiple times has the large rates of the delay times Ts, Te relative to the emission time. When, for example, the delay time Ts is longer than the delay time Te and is dominant, like a marking Ms indicated by the dashed line in FIG. 27, a marking that has a smaller area than that of the marking M is formed. In addition, when the delay time Te is longer than the delay time Ts and is dominant, like a marking Me indicated by a chain dot line in FIG. 27, a marking that has a larger area than that of the marking M is formed.

The difference in size of the marking originating from the dose amount appears regardless of the size of the marking and the shape thereof. In addition, the marking formed by a specific electron beam EBmn has a size that changes in accordance with the number of shots, but the center position is always constant regardless of the number of shots. Hence, the electron beam lithography system 10 compares the markings that are formed at different number of shots, and corrects the dose amount based on the comparison result. An explanation will be below given of a dose amount correction process.

Figure 28:
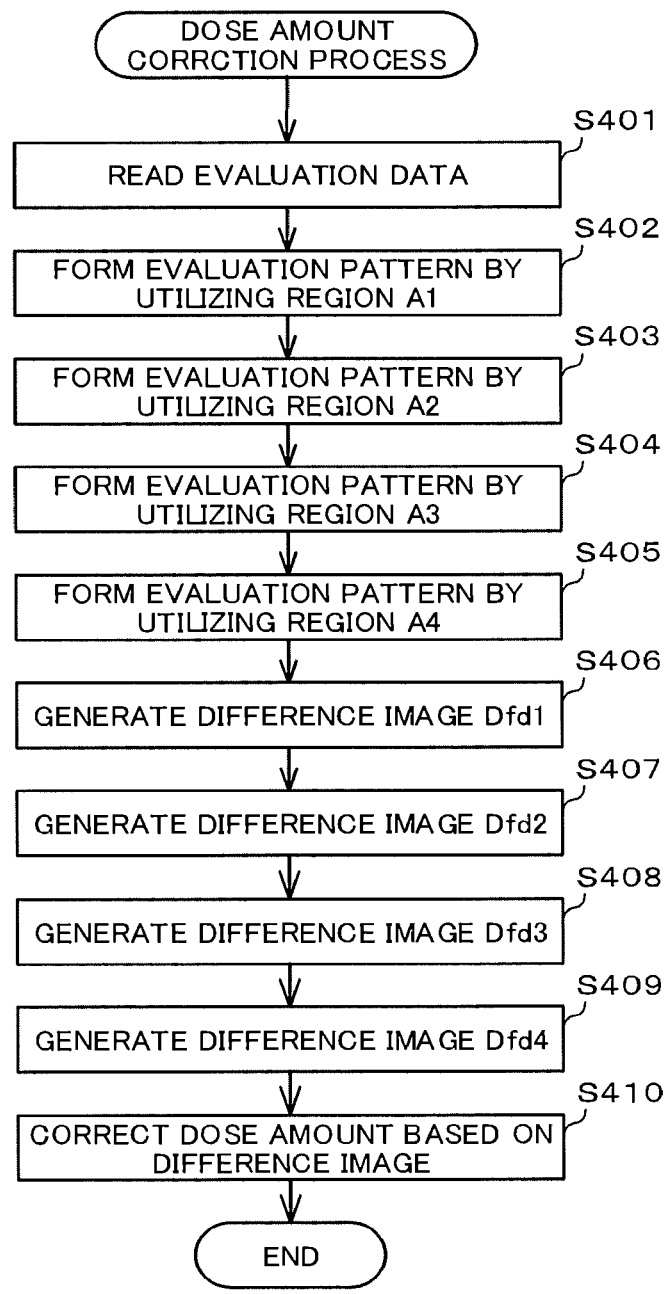
FIG. 28 is a flowchart illustrating a dose amount correction process.

The flowchart in FIG. 28 illustrates sequential processes executed by the CPU 101a in accordance with the program stored in the auxiliary memory 101c. The dose amount correction process is executed along the flowchart in FIG. 28.

First, the CPU 101*a* reads (step S401) the evaluation data stored in the auxiliary memory 101*c*. This evaluation data defines the evaluation pattern Ph0 shown in the SEM image P0 in FIG. 8.

Next, the CPU 101*a* forms (step S402) the evaluation pattern by utilizing the region A1 of the aperture 51. In order to form the evaluation pattern by utilizing the region A1, blanking is performed on the electron beams EBmn other than the electron beams EBmn passing through, for example, the openings H1*l*-H14, H21-H24, H31-H34, and H41-H44. Next, the CPU 101*a* forms the evaluation pattern P1 based on the evaluation data using the 16 electron beams EB11-EB14, EB21-EB24, EB31-EB34, and EB41-EB44.

In order to form the evaluation pattern P1, as illustrated in FIG. 12, first, the marking group MG1 including the 16 markings in a four-by-four matrix arrangement is formed. In this case, the respective markings are simultaneously formed using the 16 electron beams EB11-EB14, EB21-EB24, EB31-EB34, and EB41-EB44. In addition, when the marking is formed, the electron beams EB11-EB14, EB21-EB24, EB31-EB34, and EB41-EB44 are intermittently emitted to the sample 120 so as to be shot by multiple times, thereby forming the respective markings. In this case, for example, the electron beam is shot by four times to form the marking.

As explained above, the emission time of each electron beam EBmn incident to the sample 120 when the marking Mmn is formed is a constant value that is Td0. Hence, when the marking is formed by the electron beam EBmn shot by N times, the emission time per a shot becomes Td0/N. More specifically, when the marking is formed by the electron beam shot by four times, the emission time per a shot becomes Td0/4.

Like the similar scheme, as illustrated in FIG. 13, the marking group MG2 is formed at the +Y side relative to the marking group MG1, and as illustrated in FIG. 14, the marking group MG3 is formed at the −X side relative to the marking group MG1. In addition, as illustrated in FIG. 15, the marking group MG4 is formed at the −X side relative to the marking group MG2.

Figure 29:
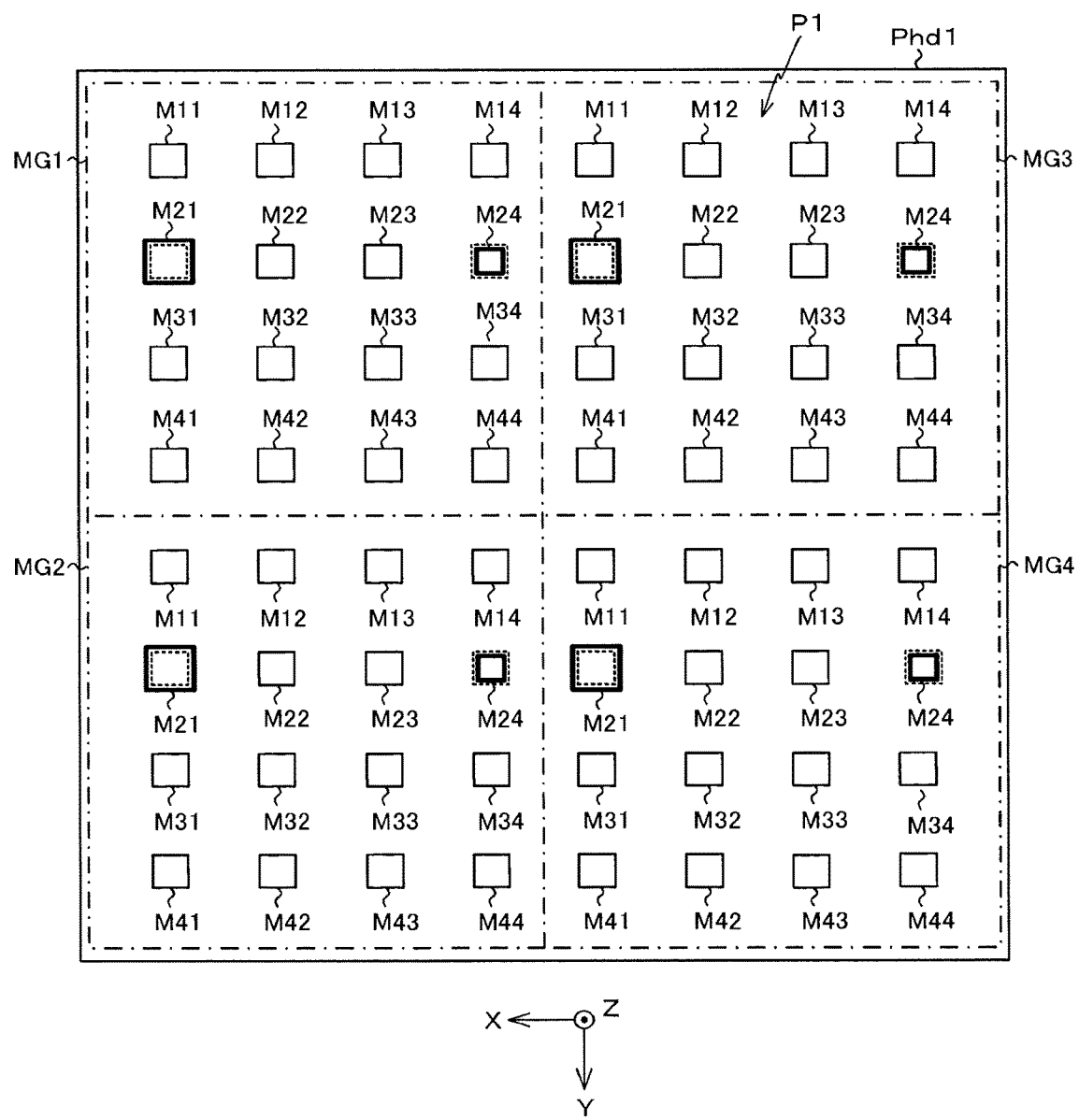
FIG. 29 is a diagram showing an SEM image of an evaluation pattern.

FIG. 29 is a diagram illustrating an SEM image Phd1 of the evaluation pattern P1. As illustrated in FIG. 29, by forming the marking groups MG1-MG4 as explained above, the evaluation pattern P1 including the marking groups MG1-MG4 is formed. In the evaluation pattern P1, each marking group MG1-MG4 includes the 16 markings M11-M14, M21-M24, M31-M34, and M41-M44 formed by the electron beams EB11-EB14, EB21-EB24, EB31-EB34, and EB41-EB44, respectively.

In the example case illustrated in FIG. 29, because of the error in dose amount, the sizes of the markings M21, M24 formed by the respective electron beams EB21, EB24 differ from the originally intended size. More specifically, as for the electron beam EB21, since the emission time exceeds Td0, the marking has a larger size than the originally intended size. Next, as for the electron beam EB24, since the emission time is shorter than Td0, the marking has a smaller size than the originally intended size.

Next, the CPU 101*a* forms (step S403) the evaluation pattern by utilizing the region A2 of the aperture 51. In order to form the evaluation pattern by utilizing the region A2, blanking is performed on the electron beams EBmn other than the electron beams EBmn passing through, for example, the openings H51-H54, H61-H64, H71-H74, and H81-H84. Next, like the formation of the evaluation pattern P1, the CPU 101*a* forms an evaluation pattern P2 based on the evaluation data using the 16 electron beams EB51-EB54, EB61-EB64, EB71-EB74, and EB81-EB84. In addition, when the evaluation pattern P2 is formed, the electron beams EB51-EB54, EB61-EB64, EB71-EB74, and EB81-EB84 are intermittently emitted to the sample 120 so as to be shot by multiple times, thereby forming the evaluation pattern P2.

Figure 30:
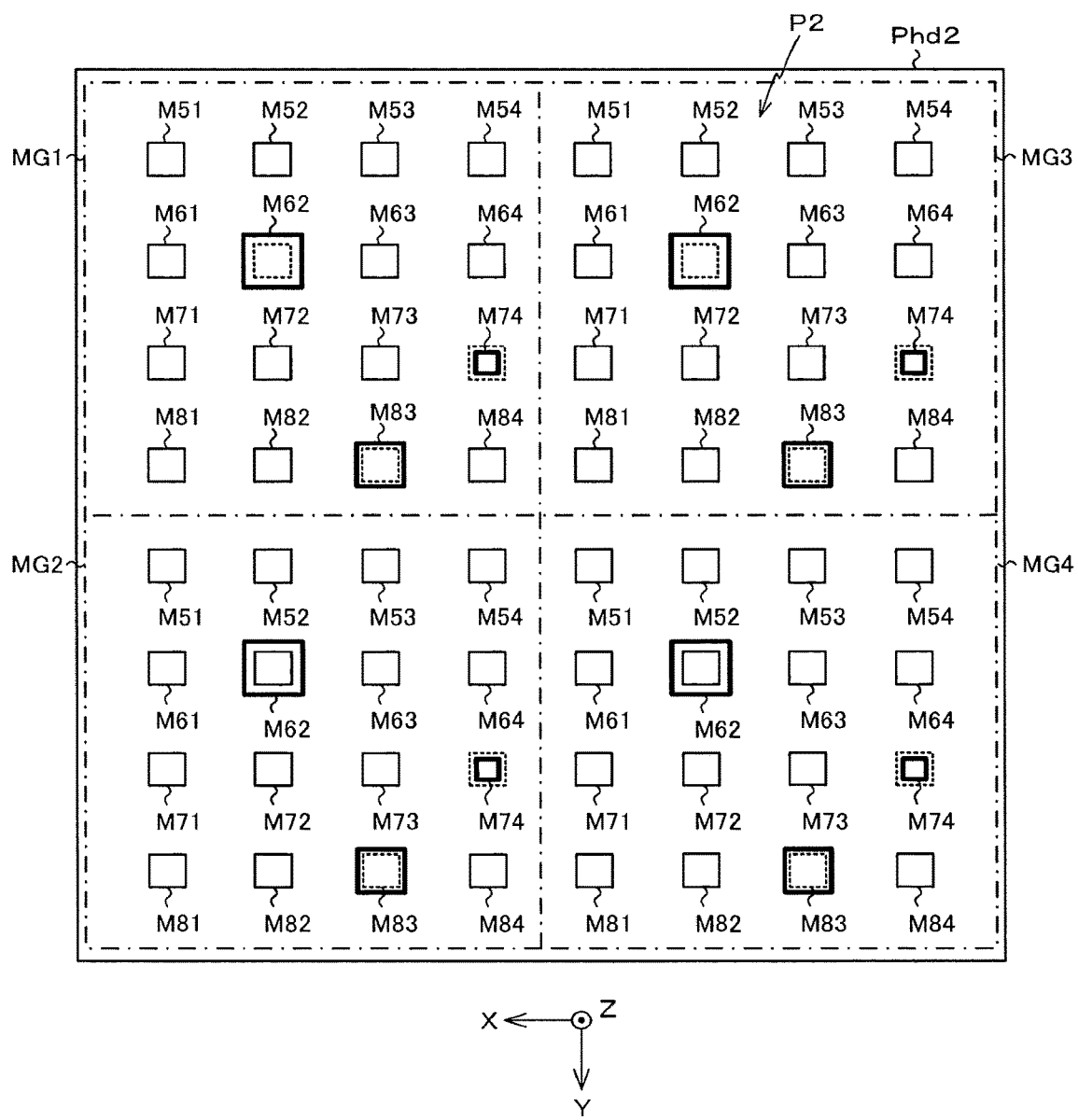
FIG. 30 is a diagram showing an SEM image of the evaluation pattern.

FIG. 30 is a diagram illustrating an SEM image Phd2 of the evaluation pattern P2. As illustrated in FIG. 30, by forming the marking groups MG1-MG4 through the above scheme, the evaluation pattern P2 including the marking groups MG1-MG4 is formed. In the evaluation pattern P2, each marking group MG1-MG4 includes the 16 markings M51-M54, M61-M64, M71-M74, and M81-M84 formed by the electron beams EB51-EB54, EB61-EB64, EB71-EB74, and EB81-EB84, respectively.

In the example case illustrated in FIG. 30, because of the error in dose amount, the sizes of the markings M62, M74, and M83 formed by the respective electron beams EB62, EB74, and EB84 differ from the originally intended size. More specifically, as for the electron beams EB62, EB83, since the emission time exceeds Td0, the respective markings have a larger size than the originally intended size. Next, as for the electron beam EB74, since the emission time is shorter than Td0, the marking has a smaller size than the originally intended size.

Subsequently, the CPU 101*a* forms (step S404) the evaluation pattern by utilizing the region A3 of the aperture 51. In order to form the evaluation pattern by utilizing the region A3, blanking is performed on the electron beams EBmn other than the electron beams EBmn passing through, for example, the openings H15-H18, H25-H28, H35-H38, and H45-H48. Next, like the formation of the evaluation patterns P1, P2, the CPU 101*a* forms an evaluation pattern P3 based on the evaluation data using the 16 electron beams EB15-EB18, EB25-EB28, EB35-EB38, and EB45-EB48. In addition, when the evaluation pattern P3 is formed, the electron beams EB15-EB18, EB25-EB28, EB35-EB38, and EB45-EB48 are intermittently emitted to the sample 120 so as to be shot by multiple times, thereby forming the evaluation pattern P3.

Figure 31:
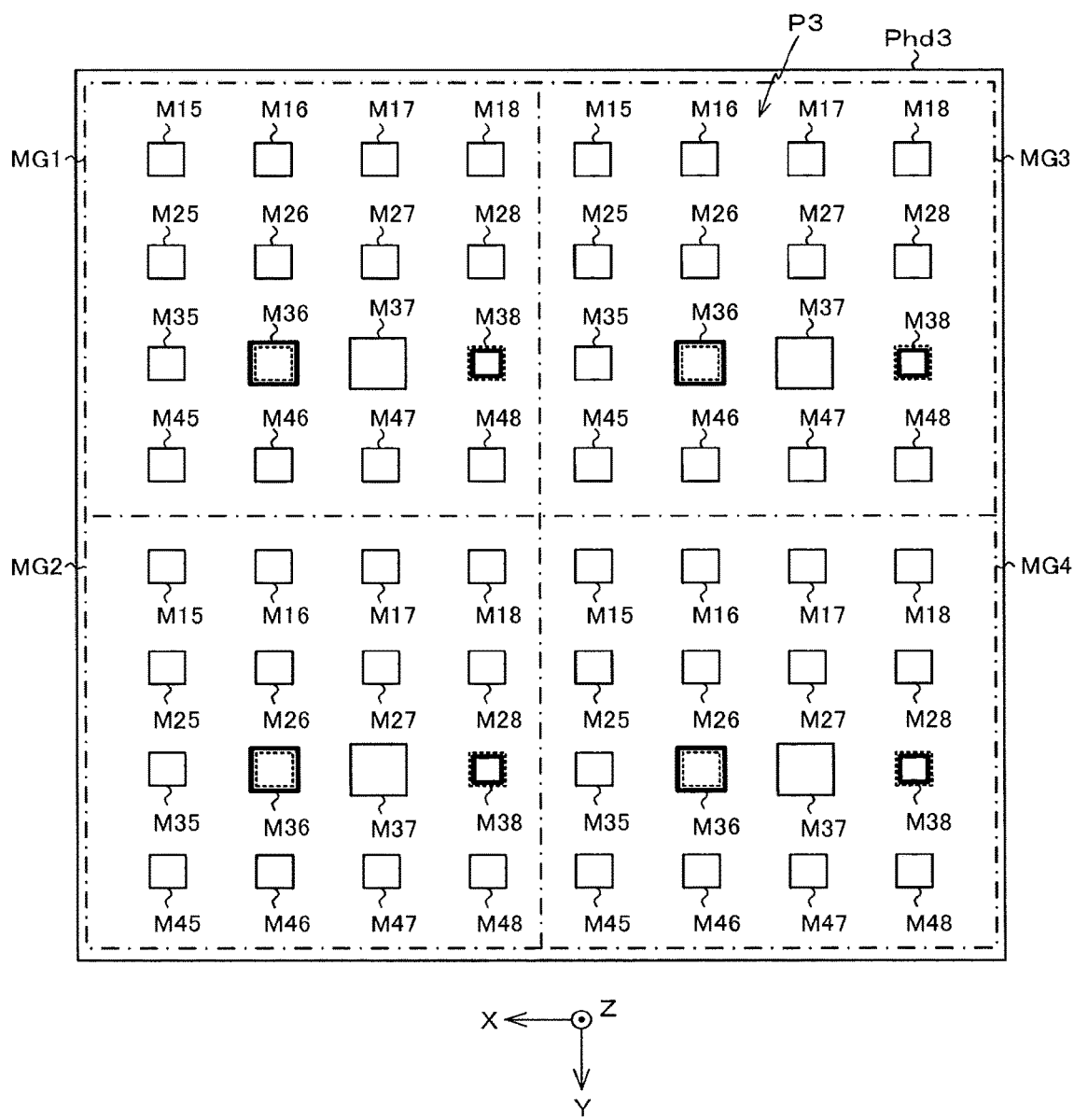
FIG. 31 is a diagram showing an SEM image of the evaluation pattern.

FIG. 31 is a diagram illustrating an SEM image Phd3 of the evaluation pattern P3. As illustrated in FIG. 30, by forming the marking groups MG1-MG4 through the above scheme, the evaluation pattern P3 including the marking groups MG1-MG4 is formed. In the evaluation pattern P3, each marking group MG1-MG4 includes the 16 markings M15-M18, M25-M28, M35-M38, and M45-M48 formed by the electron beams EB15-EB18, EB25-EB28, EB35-EB38, and EB45-EB48, respectively.

In the example case illustrated in FIG. 31, because of the error in dose amount, the sizes of the markings M36, M38 formed by the respective electron beams EB36, EB38 differ from the originally intended size. More specifically, as for the electron beam EB36, since the emission time exceeds Td0, the marking has a larger size than the originally intended size. Next, as for the electron beam EB38, since the emission time is shorter than Td0, the marking has a smaller size than the originally intended size.

Next, the CPU 101*a* forms (step S405) the evaluation pattern by utilizing the region A4 of the aperture 51. In order to form the evaluation pattern by utilizing the region A4, blanking is performed on the electron beams EBmn other than the electron beams EBmn passing through, for example, the openings H55-H58, H65-H68, H75-H78, and H85-H88. Subsequently, like the formation of the evaluation patterns P1, P2, and P3, the CPU 101*a* forms an evaluation pattern P4 based on the evaluation data using the 16 electron beams EB55-EB58, EB65-EB68, EB75-EB78, and EB85-EB88. In addition, when the evaluation pattern P4 is formed, the electron beams EB55-EB58, EB65-EB68, EB75-EB78, and EB85-EB88 are intermittently emitted to the sample 120 so as to be shot by multiple times, thereby forming the evaluation pattern P4.

Figure 32:
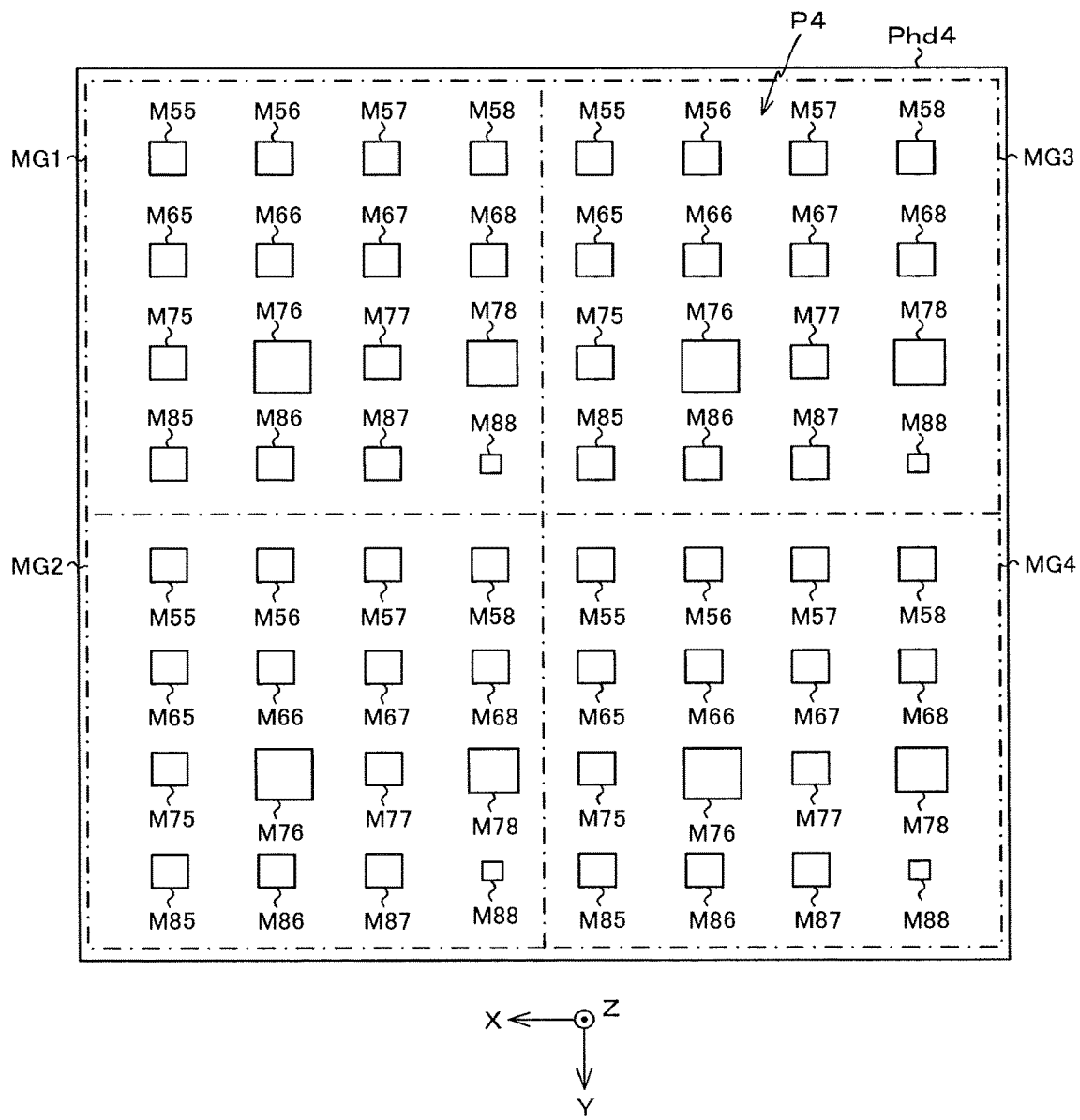
FIG. 32 is a diagram showing an SEM image of the evaluation pattern.

FIG. 32 is a diagram illustrating an SEM image Phd4 of the evaluation pattern P4. As illustrated in FIG. 32, by forming the marking groups MG1-MG4 through the above scheme, the evaluation pattern P4 including the marking groups MG1-MG4 is formed. In the evaluation pattern P4, each marking group MG1-MG4 includes the 16 markings M55-M58, M65-M68, M75-M78, and M85-M88 formed by the electron beams EB55-EB58, EB65-EB68, EB75-EB78, and EB85-EB88, respectively.

In the example case illustrated in FIG. 32, there is no marking that has a different size from the originally intended size due to the error in dose amount.

When the processes from the step S401 to the step S404 are executed, by the multiple times of electron beam shots, the evaluation patterns P1-P4 are formed on the sample 120. The evaluation patterns P1-P4 formed on the sample 120 are imaged using, for example, an SEM, and the SEM images Phd1-Phd4 are stored in the auxiliary memory 101c of the controller 101.

Next, the CPU 101a reads the SEM image Ph1 illustrated in FIG. 16 stored in the auxiliary memory 101c, and the SEM image Phd1 illustrated in FIG. 29. Subsequently, the SEM image Ph1 is compared with the SEM image Phd1 to generate (step S406) a difference image Dfd1.

As for the comparison of the SEM images, first, the CPU 101a performs matching on the SEM images Ph1 and Phd1. As for the matching of the SEM images, the SEM image Phd1 is moved relative to the SEM image Ph1, and the normalized mutual correlation of the SEM image Phd1 is calculated. Next, the SEM image Ph1 is laid over on the SEM image Phd1 based on the normalized mutual correlation. In this state, the 64 markings in the SEM image Ph1 precisely overlap the 64 markings in the SEM image Phd1. Next, the CPU 101a generates the difference image Dfd1 between the SEM image Ph1 and the SEM image Phd1. Although the SEM image is a monochrome image, the difference image Dfd1 may be binarized as needed.

Figure 33:
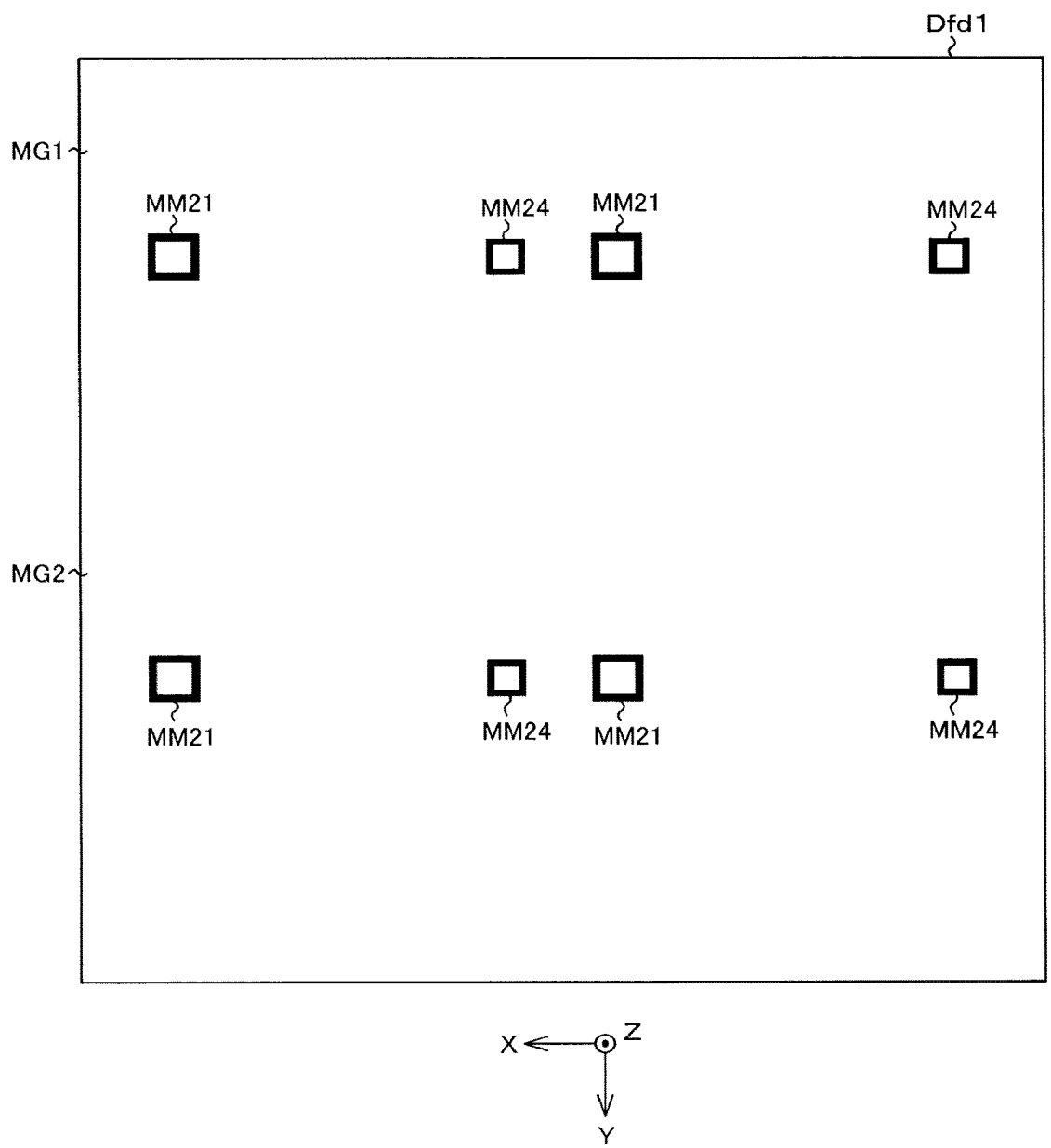
FIG. 33 is a diagram illustrating a difference image.

FIG. 33 is a diagram illustrating the difference image Dfd1. As explained above, due to the error in dose amount, the respective sizes of the markings M21, M24 in the SEM image Phd1 differ from the respective sizes of the markings M21, M24 formed by the electron beams EB21, EB 24 shot by one time. When the size of the image of the marking Mmn in the SEM image Ph1 differs from the size of the image of the marking Mmn in the SEM image Phd1, a marking MM indicating the difference between the corresponding markings Mmn appears in the difference image Dfd1. In this case, the marking MM21 for the marking M21, and the marking MM24 for the marking M24 appear in the difference image Dfd1.

Next, the CPU 101a reads the SEM image Ph2 illustrated in FIG. 17 stored in the auxiliary memory 101c, and the SEM image Phd2 illustrated in FIG. 30. Subsequently, the SEM image Ph2 is compared with the SEM image Phd2 to generate (step S407) a difference image Dfd2.

Figure 34:
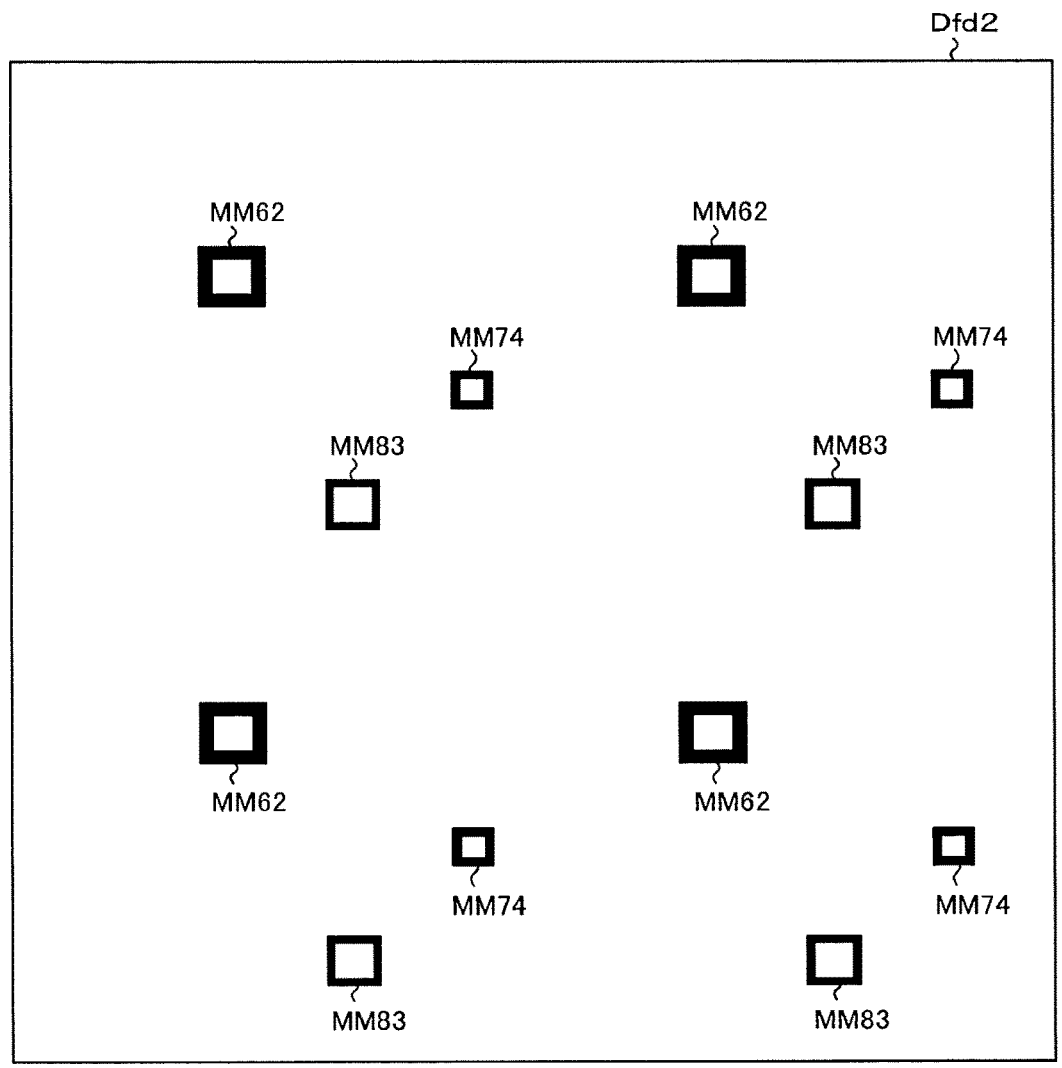
FIG. 34 is a diagram illustrating a difference image.

FIG. 34 is a diagram illustrating the difference image Dfd2. As explained above, due to the error in dose amount, the respective sizes of the markings M62, M74, and M83 in the SEM image Phd2 differ from the respective sizes of the markings M62, M74, and M83 formed by the electron beams EB62, EB 74, and EB83 shot by one time. In this case, the marking MM62 for the marking M62, the marking MM74 for the marking M74, and the marking MM83 for the marking M83 appear in the difference image Dfd2.

Next, the CPU 101a reads the SEM image Ph3 illustrated in FIG. 18 stored in the auxiliary memory 101c, and the SEM image Phd3 illustrated in FIG. 31. Subsequently, the SEM image Ph3 is compared with the SEM image Phd3 to generate (step S408) a difference image Dfd3.

Figure 35:
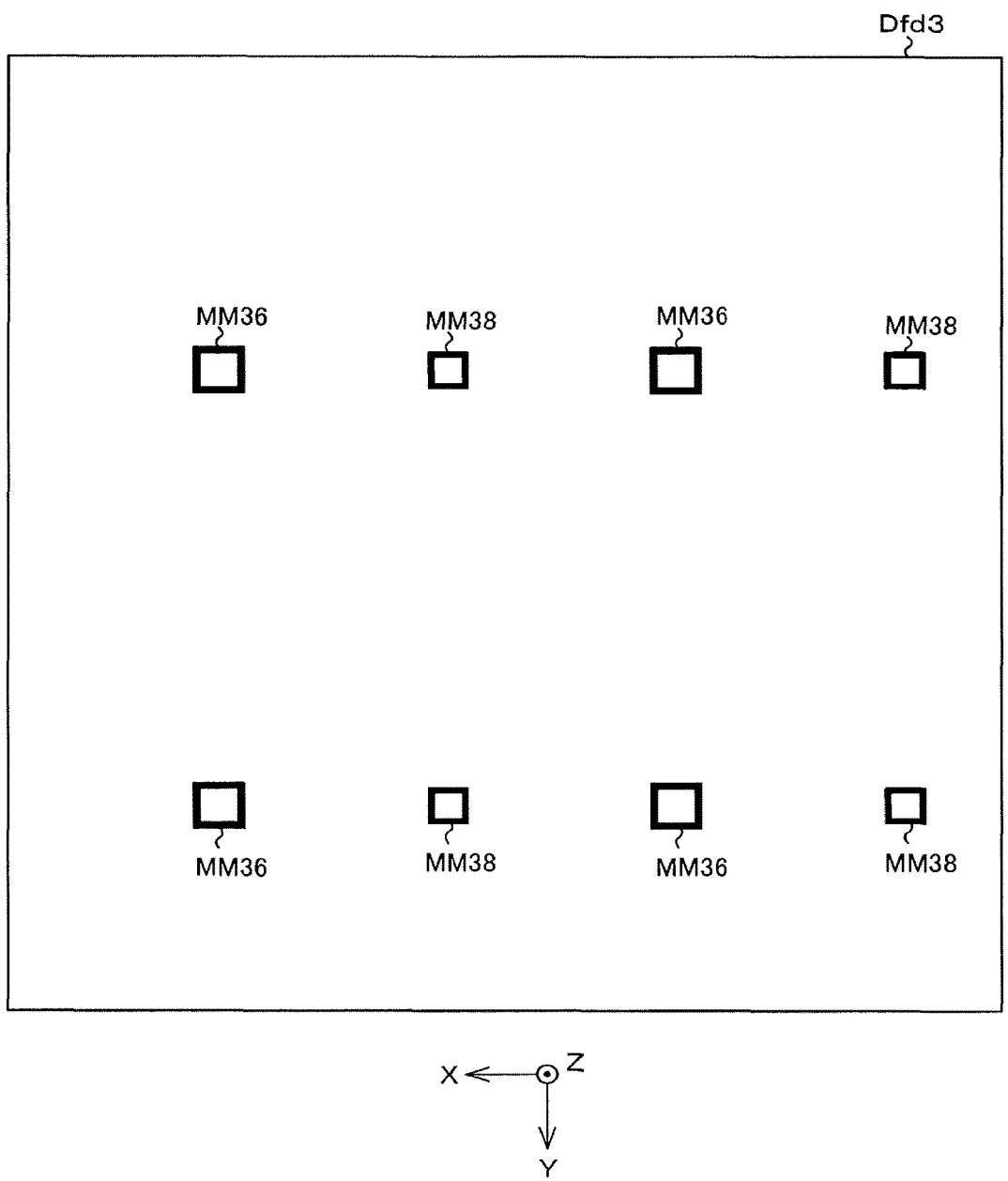
FIG. 35 is a diagram illustrating a difference image.

FIG. 35 is a diagram illustrating the difference image Dfd3. As explained above, due to the error in dose amount, the respective sizes of the markings M36, M38 in the SEM image Phd3 differ from the respective sizes of the markings M36, M38 formed by the electron beams EB36, EB 38 shot by one time. In this case, the marking MM36 for the marking M36, and the marking MM38 for the marking M38 appear in the difference image Dfd3.

Next, the CPU 101a reads the SEM image Ph4 illustrated in FIG. 19 stored in the auxiliary memory 101c, and the SEM image Phd4 illustrated in FIG. 32. Subsequently, the SEM image Ph4 is compared with the SEM image Phd4 to generate (step S409) a difference image Dfd4.

Figure 36:
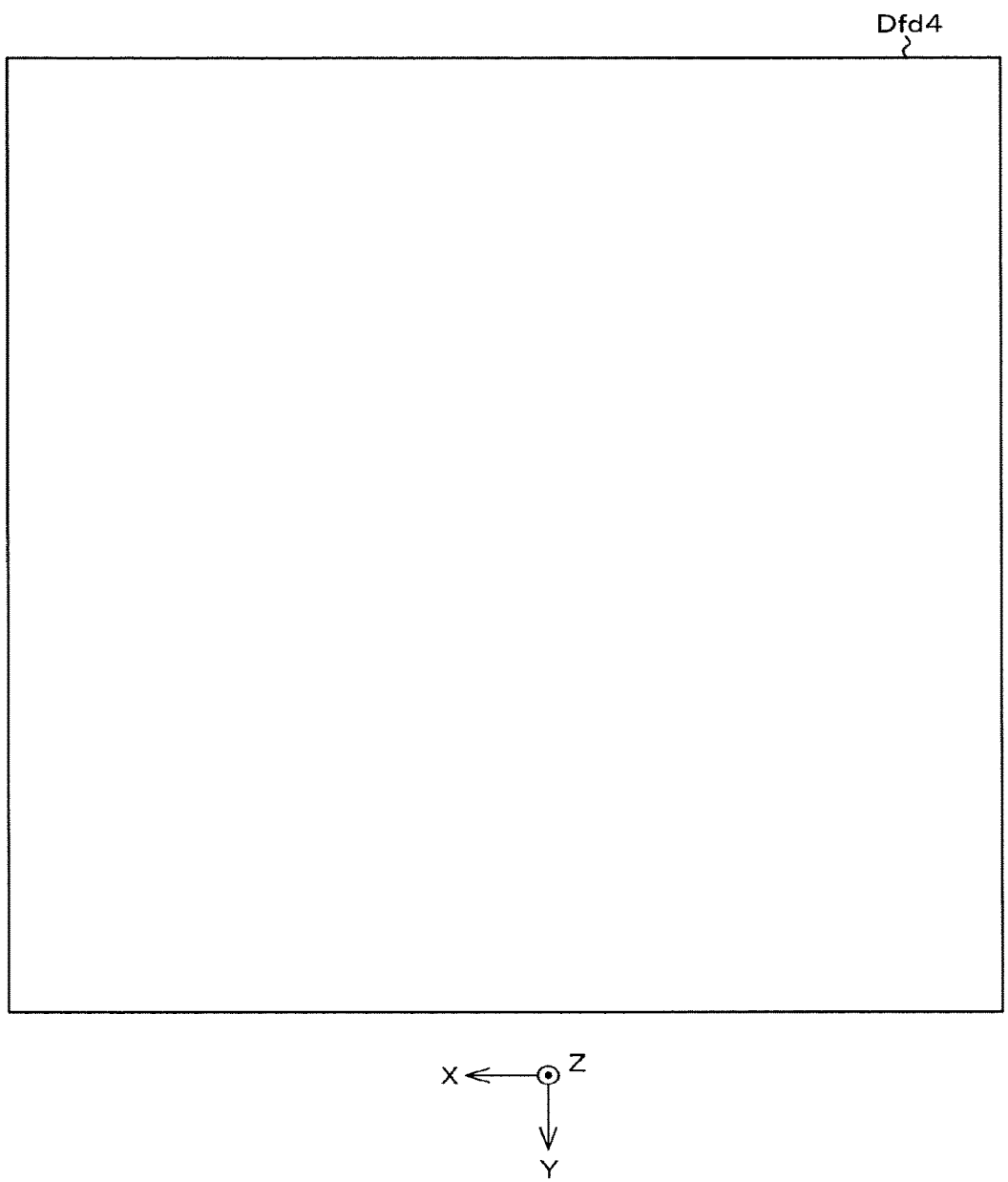
FIG. 36 is a diagram illustrating a difference image.

FIG. 36 is a diagram illustrating the difference image Dfd4. As explained above, the size of each marking in the SEM image Phd4 is equal to the size of the marking formed by a shot. In this case, no marking MM appears in the difference image Dfd4.

Next, the CPU 101a corrects (step S410) the dose amount of the electron beam EBmn based on the difference images Dfd1-Dfd4.

The correction of the dose amount is made based on the area of the marking MM appearing in the difference image Dfd1-Dfd4. In this case, the area of the marking MMmn in the difference image Dfd1-Dfd4 is defined as Sdmn. The area Sdmn indicates the area of the marking in the SEM image Phd1-Phd4 relative to the marking in the SEM image Ph1-Ph4. Hence, when the marking in the SEM image Phd1-Phd4 is larger than the marking in the SEM image Ph1-Ph4, the area Sd becomes a positive value. Conversely, when the marking in the SEM image Phd1-Phd4 is smaller than the marking in the SEM image Ph1-Ph4, the area Sd becomes a negative value.

An error Dsmn in the emission time per a shot of electron beam is indicatable as a function G(Sdmn) that has a variable which is the area Sdmn. Hence, the CPU 101a calculates the error Dsmn for each electron beam EBmn based on the following formula (1).

$$Dsmn = G(Sdmn) \tag{1}$$

When calculating the error Dsmn, the CPU 101a corrects an emission time Tbmn of the electron beam EBmn based on the following formula (2), and calculates a new emission time Tamn.

$$Tamn = Tbmn + Dsmn \tag{2}$$

For example, as explained in the first embodiment, when the emission times Td1(i)-Td4(i) are calculated, the emission times Td1(i)-Td4 (i) are corrected by the following formulae, and new emission times TAd1(i)-Tad4(i) are calculated.

$$TAd1(i) = Td(i) + Dsmn$$

$$TAd2(i) = Td(i) + Dsmn$$

$$TAd3(i) = Td(i) + Dsmn$$

$$TAd4(i) = Td(i) + Dsmn$$

When calculating the corrected emission times TAd1(i)-TAd4(i) for the respective 64 electron beams EBmn, the CPU 101a stores the corrected emission times TAd1(i)-TAd4(i) in the auxiliary memory 101c, and ends the correction process.

According to the electron beam lithography system 10, when the pattern is formed, the electron beam EBmn is emitted based on the calculated emission times TAd1(i)-TAd4(i). Hence, the error in dose amount per a shot is corrected for each electron beam EBmn, and thus the electron beam EBmn is enabled to be emitted to the sample 120 so as to accomplish the dose amount based on the designed value.

As explained above, according to this embodiment, the error in dose amount per a shot is corrected (step S410) for each electron beam EBmn. Hence, the difference in dose amount per a shot among the electron beams EBmn is eliminated, and consequently, a formation of the precise pattern on the sample is enabled using the multiple electron beams EBmn.

In this embodiment, the variability in dose amount originating from the variability in area of the opening Hmn of the aperture 51 is adjusted through the correction process (step S301-step S312). Next, the error in dose amount due to a shooting of the electron beam EBmn is corrected. Accordingly, a formation of the pattern at the target dose amount is enabled.

In the case of multi-beam type electron beam lithography systems, in general, a pattern is formed using equal to or greater than 1000 electron beams. Hence, the aperture 51 that splits the electron beam from the electron gun 30 is provided with a large number of opening in practice. Accordingly, it is difficult for conventional technologies to evaluate the area variability for each opening of the aperture 51. In addition, as for the dose amount of each electron beam, an error relative to the target dose amount occurs due to the rise of the blanking signal and the fall thereof. It is relatively difficult to distinguish the error in dose amount originating from the blanking signal, etc., and the error in dose amount originating from the area variability of the opening. However, execution of the dose amount correction process according to this embodiment enables a precise correction of the error in dose amount originating from the blanking signal, etc.

In addition, according to this embodiment, the error in dose amount originating from the blanking signal, etc., is quantitatively obtainable based on the area of the marking MM appearing in the difference image. This enables a proper evaluation on not only the error in dose amount but also the area variability of the opening.

Note that in this embodiment, as an example, the marking M forming the evaluation pattern P1-P4 is formed by the electron beam shot by four times. However, the present disclosure is not limited to this case, and the marking M may be formed by the electron beam shot by twice or three times, or may be formed by the electron beam shot by equal to or greater than five times.

The dose amount correction process according to this embodiment is capable of calculating the error in dose amount based on the difference image obtained by a comparison of the SEM images showing the evaluation patterns P1-P4 formed at the different number of shots from each other. According to this embodiment, the evaluation on the dose amount is made using the difference images Dfd1-Dfd4 obtained from the SEM images Ph1-Ph4 with the marking M formed by the electron beam shot by one time, and the SEM images Phd1-Phd4 with the marking M formed by the electron beam shot by the n times. However, the present disclosure is not limited to this case, and the evaluation on the dose amount may be made using the difference images Dfd1-Dfd4 obtained from the SEM images Ph1-Ph4 with the marking M formed by the electron beam shot by the m times, and the SEM images Phd1-Phd4 with the marking formed by the electron beam shot by the n times. However, a condition m≠n should be satisfied.

Embodiments of the present disclosure have been explained above, but the present disclosure is not limited to the above embodiments. For example, in the above embodiments, the evaluation on the respective regions A1-A4 of the aperture 51 is made using the difference image generated based on the SEM images Ph1-Ph4. However, how to compare the SEM images Ph1-Ph4 is not limited to this case. For example, the evaluation on the respective regions A1-A4 of the aperture 51 may be made based on a comparison of the average brightness of each region in the SEM image.

In the above embodiments, as illustrated in FIG. 11, the explanation has been given of a case in which the aperture 51 is divided into the four regions A1-A4. However, the present disclosure is not limited to this case, and the aperture 51 may be divided into equal to or greater than five regions.

In the above embodiments, the explanation has been given of a case in which the evaluation on the aperture 51 is made using the evaluation pattern P0 formed by all electron beams EBmn. However, this evaluation pattern P0 may be formed using some electron beams among all electron beams EBmn. In this case, for example, the evaluation pattern P0 may be formed using the electron beams EB1m, EB3m, EB5m, and EB7m, or the electron beams EBn1, EBn3, EBn5, and EBn7.

In the above embodiments, the explanation has been given of a case in which the 64 openings Hmn are formed in the aperture 51. However, the present disclosure is not limited to this case, and equal to or less than 63 openings may be formed in the aperture 51, or equal to or greater than 65 openings may be formed therein.

In the above embodiments, the explanation has been given of a case in which the controller 101 of the electron beam lithography system 10 executes the evaluation process and the correction process. However, the present disclosure is not limited to this case, and separate inspection device and computer from the electron beam lithography system 10 may execute the evaluation process and the correction process.

In the above embodiments, the explanation has been given of a case in which the evaluation process, etc., is executed using the SEM images Ph0-Ph4 of the evaluation pattern. However, the present disclosure is not limited to this case, and when the inspection device and the electron beam lithography system 10 have a function of observing the evaluation pattern, the evaluation process, etc., may be executed using the image picked up by the above device instead of the SEM image.

The function of the controller 101 according to the above embodiments can be accomplished by not only exclusive hardware resources but also a normal computer system. The program stored in the auxiliary memory 101c of the controller 101 may be distributed in a manner stored in a non-transitory computer readable recording medium, such as a flexible disk, a Compact Disk Read-Only Memory (CD-ROM), or a Digital Versatile Disk (DVD). In addition, the program may be stored in the auxiliary memory 101c by installing the program in a computer via the Internet.

All of or a part of the program may be executed by, for example, a server device, and the controller 101 that receives the execution result via a network may execute the above processes (steps S101-S410).

Although several embodiments of the present disclosure have been explained, those embodiments are merely presented as examples, and are not intended to limit the scope of the present disclosure. Those novel embodiments can be carried out in other various forms, and various omissions, replacements, and modifications can be made without departing from the scope of the present disclosure. Those embodiments and modified forms thereof are within the scope of the present disclosure, and also within the scope and spirit of the invention as recited in appended claims and the equivalent range thereto.

The invention claimed is:

1. An evaluation method to evaluate a precision of an aperture formed with multiple openings, the method comprising:
   forming a first evaluation pattern based on first evaluation data using multiple electron beams generated by an electron beam that has passed through the aperture;
   dividing the aperture into multiple regions, each of the regions including a subset of the multiple openings that is less than all the multiple openings in the aperture, and defining the multiple divided regions;
   forming a second evaluation pattern based on second evaluation data using a third evaluation pattern formed by multiple electron beams that have passed through a first divided region among the multiple divided regions;
   comparing the first evaluation pattern with the second evaluation pattern; and
   evaluating the precision of the aperture based on the comparison result between the first evaluation pattern and the second evaluation pattern.

2. The evaluation method according to claim 1, wherein in forming the second evaluation pattern, the second evaluation pattern is formed for each of the divided regions.

3. The evaluation method according to claim 1, wherein:
   the first and second evaluation patterns each include a marking formed by each of the multiple electron beam; and
   in comparing the first evaluation pattern with the second evaluation pattern, a size of the marking in the first evaluation pattern is compared with a size of the marking in the second evaluation pattern corresponding to the marking in the first evaluation pattern.

4. The evaluation method according to claim 1, wherein in forming the second evaluation pattern:
   the second evaluation pattern is formed for each of the divided regions; and
   in comparing the first evaluation pattern with the second evaluation pattern, the first evaluation pattern is compared with each of the second evaluation patterns formed for each of the divided regions.

5. The evaluation method according to claim 1, wherein in evaluating the precision of the aperture, the precision of the aperture is evaluated based on a deviation between a size of a marking in the first evaluation pattern and a size of a marking in the second evaluation pattern corresponding to the marking in the first evaluation pattern.

6. The evaluation method according to claim 1, wherein in comparing the first evaluation pattern with the second evaluation pattern, the first evaluation pattern and the second evaluation pattern are compared with each other for each of the divided regions.

7. The evaluation method according to claim 6, wherein in evaluating the precision of the aperture, the precision of the aperture is evaluated based on a number of the divided regions having the evaluation that is equal to or smaller than a threshold.

8. A recording medium storing a program causing a controller for an electron beam lithography system including an aperture formed with multiple openings to execute:
   forming a first evaluation pattern based on first evaluation data using multiple electron beams generated by an electron beam that has passed through the aperture;
   dividing the aperture into multiple regions, each of the multiple regions including a subset of the multiple openings that is less than all the multiple openings in the aperture, and defining the multiple divided regions;
   forming a second evaluation pattern based on second evaluation data using a third evaluation pattern formed by multiple electron beams that have passed through a first divided region among the multiple divided regions;
   comparing the first evaluation pattern with the second evaluation pattern; and
   evaluating a precision of the aperture based on a comparison result between the first evaluation pattern and the second evaluation pattern.

9. An electron beam lithography system comprising an aperture formed with multiple openings, and forming a pattern on a sample, the system comprising:
   a memory storing a program; and
   a controller executing the program stored in the memory, wherein the program is to execute:
   forming a first evaluation pattern based on first evaluation data using multiple electron beams generated by an electron beam that has passed through the aperture;
   dividing the aperture into multiple regions, each of the multiple regions including a subset of the multiple openings that is less than all the multiple openings in the aperture, and defining the multiple divided regions;
   forming a second evaluation pattern based on second evaluation data using a third evaluation pattern formed by multiple electron beams that have passed through a first divided region among the multiple divided regions;
   comparing the first evaluation pattern with the second evaluation pattern; and
   evaluating the precision of the aperture based on the comparison result between the first evaluation pattern and the second evaluation pattern.

* * * * *